United States Patent

Yuasa et al.

[11] Patent Number: 5,968,377
[45] Date of Patent: Oct. 19, 1999

[54] TREATMENT METHOD IN GLOW-DISCHARGE PLASMA AND APPARATUS THEREOF

[75] Inventors: Motokazu Yuasa, Nara; Takuya Yara, Mishima-gun, both of Japan

[73] Assignee: Sekisui Chemical Co., Ltd., Osaka, Japan

[21] Appl. No.: 08/861,689

[22] Filed: May 22, 1997

[30] Foreign Application Priority Data

May 24, 1996 [JP] Japan ........................... 8-130124
Sep. 26, 1996 [JP] Japan ........................... 8-255143

[51] Int. Cl.⁶ .................................................. B23K 10/00
[52] U.S. Cl. ............................. 219/121.41; 219/121.43; 219/121.54; 118/723 R; 204/192.12
[58] Field of Search ................. 219/121.43, 121.44, 219/121.54, 121.4, 121.52, 121.59, 121.41; 118/723 FE, 723 R; 204/192.12, 298.08

[56] References Cited

U.S. PATENT DOCUMENTS 5,286,360  2/1994  Szczyrbowski et al. .
5,539,303  7/1996  Okazako et al. .................. 324/536
5,607,509  3/1997  Schumacher et al. ........ 118/723 FE
5,654,043  8/1997  Shao et al. .................... 427/527
5,770,023  6/1998  Sellers ........................ 204/192.3
5,792,517  8/1998  Takeuchi et al. ................ 427/444

FOREIGN PATENT DOCUMENTS 0 467 639  1/1992  European Pat. Off. .
0 591 675  4/1994  European Pat. Off. .
97/13266   4/1997  WIPO .

Primary Examiner—Mark Paschall
Attorney, Agent, or Firm—Kanesaka & Takeuchi

[57] ABSTRACT

In a glow-discharge plasma treatment, a substrate is disposed between two opposing electrodes, at least one electrode being covered by a solid dielectric at an opposing surface. An electric field is imposed between the electrodes in an atmospheric pressure. The electric field is pulse modulated such that an onset time, prefeably an offset time as well, of a pulse is less than 100 $\mu$s, and field intensity is 1 to 100 kV/cm. Thus, a stable and evenly dispersed discharge-plasma is obtained, which can treat an outer to surface of the substrate.

20 Claims, 17 Drawing Sheets

TREATMENT METHOD IN GLOW-DISCHARGE PLASMA AND APPARATUS THEREOF

BACKGROUND OF THE INVENTION AND RELATED ART STATEMENT

The invention relates to treatment methods of glow-discharge plasma near the atmospheric pressure and apparatus thereof.

Surface modification or treatment by applying glow-discharge plasma under a low pressure is known and has been practiced. However, the treatment under a low pressure is not advantageous for commercial application and has to be limited to the treatment of highly priced parts, such as electronic devices. More advantageous treatment methods which involve in discharging plasma near the atmospheric pressure have been proposed. For example, U.S. Pat. No. 5,126,164 discloses methods to treat in the atmosphere of helium gas, and U.S. Pat. No. 5,124,173 discloses methods to treat in the atmosphere of argon plus acetone and/or helium.

These methods are restrictive due to the fact that they require to generate plasma in an atmosphere containing helium or acetone as the essential component. The process will be commercially disadvantageous because of the high price of helium. Acetone can primarily be used in a hydrophilic treatment, because it would react with the surface being treated and give a hydrophilic finish.

U.S. Pat. No. 5,529,631 discloses an art of continuous web treatment under the atmospheric pressure in which air in the treating chamber is replaced by a desirable gas, such as helium, which is then continually supplied during the operation and the web is treated in this loosely sealed treating chamber where the discharge-plasma is provided. However, when the line speed exceeds 3 m/min in this process, air is engulfed into the chamber and disturbs the electric discharge to make it difficult to obtain the expected result.

It is an object of the invention to provide a stable method and an apparatus for surface treatment by electric discharge-plasma that is generated near or around the atmospheric pressure.

It is another object of the invention to provide an effective method of plasma treatment for a wide range of gas atmosphere.

It is a further object of the invention to provide a method and an apparatus of a glow-discharge plasma treatment for a continuously running web at a fast speed near the atmospheric pressure.

SUMMARY OF THE INVENTION

A first aspect of the present invention provides a method of glow-discharge plasma treatment, which comprises placing a substrate between two opposing electrodes, at least one of the opposing surfaces being covered with a solid dielectric; and imposing an electric field between the opposing electrodes around the atmospheric pressure, wherein the electric field is pulse modulated in a manner such that an onset time is less than 100 microseconds ($\mu s$), and field intensity is 1 to 100 kV/cm. Preferably, an offset time is less than 100 $\mu s$, as well.

A schematic process diagram of the glow-discharge plasma treatment is shown in FIG. 1.

In the apparatus of FIG. 1, an upper electrode 14 is opposing to a lower electrode 15; a solid dielectric 16 is placed on the lower electrode 15; and a substrate 17 to be treated is located on the solid dielectric. Glow-discharge plasma is generated in a space between the upper electrode 14 and the solid dielectric 16, when a specific electric field is applied between the electrodes 14 and 15. Gas atmosphere in the space for plasma is controlled by sending a treating gas through gas inlet pipes 18 and 19, so that various desired treatments can be achieved.

In the present invention, the electric field imposed between the opposing electrodes is pulse modulated in a manner such that the onset time, preferably offset time as well, is less than 100 $\mu s$, and the field intensity is 1 to 100 kV/cm.

It is known in the art that the glow-discharge is not maintained stably around the atmospheric pressure, but transformed immediately into an arc discharge, unless a special atmosphere is provided by feeding a stabilizing gas, such as above mentioned helium or acetone. In the present invention, a stable glow-discharge is maintained because a specific pulse modulated electric field is applied. It is supposed in this case that a cycle is repeated in which the glow-discharge is cut before transforming into arc discharge and is started in the next instance.

In and around the atmospheric pressure, the method of this invention of imposing a pulse modulated electric field enables to maintain a stable glow-discharge for the first time without helium or acetone gas, in which the glow-discharge is maintained for a longer period of time before transforming into the arc discharge.

The present invention does not choose any particular gas atmosphere and provides an electric discharge-plasma in the air. In the art, no matter whether it is processed under the low pressure or what kind of stabilizing gas is used, it requires processes conducted in a vessel totally isolated from air. But the present invention provides open-to-air or non-airtight system. Furthermore, the pulse modulated electric field provides a high density plasma state which gives a significant advantage to the commercial continuous web treating process.

The above-mentioned high density plasma state is attributed to the two principles involved in this invention. Firstly, the pulse modulated electric field having a field intensity of 1 to 100 kV/cm and a very steep impulse which has less than 100 $\mu s$ onset time, preferably offset time as well, efficiently excites the gaseous molecules in the space for plasma generation. Contrarily, a pulse modulated electric field having pulses of long onset or offset time (slow onset or offset) is equivalent to a series of graded electric field given in a sequence. It will first excite the molecules of low ionizing energy (low primary potential energy) and, when the higher energy arrives, the ionized molecules will further be excited to a higher level, thus lowering the efficiency of ionization of the molecules of higher potential energy. On the contrary, the steeply onset or offset pulse of less than 100 $\mu s$ would more uniformity and simultaneously provide energy to the molecules existing in the field, yielding more ionized molecules, i.e. higher plasma density.

Secondly, since this method provides stable plasma, molecules having more electrons than helium (i.e. having larger molecular weight (hereinafter MW)) may be selected as the atmospheric gas and, as a result, one can expect to have a high plasma density.

As mentioned above, traditionally helium has been used as the atmospheric gas because of the long life of its ionized molecule, which results in the longer life of glow-discharge before transforming to arc discharge. But as long as the transformation to arc discharge can be prevented, it is better to use larger molecules which are more readily ionized and thereby increase the number of ionized molecules, resulting in a higher density of plasma. In the art, it was not possible to obtain glow-discharge plasma unless the atmosphere contains more than 90% helium. The only exception is the discharge-plasma obtained by imposing a sine wave in an argon/acetone atmosphere, described in U.S. Pat. No. 5,124,173. However it is doubtful if this process would be stable and commercially practical.

In the present invention, a stable glow-discharge is obtained in a gas atmosphere, in which more than 50 vol. % is a compound having a higher MW than 10, which exceeds the mass number of helium.

The atmospheric pressure mentioned above means a pressure range of 100 to 800 Torr. In the practice, it is preferable to use a pressure between 700 and 780 Torr because the pressure is easily controlled at this range by using simple devices.

In the present invention, the plasma is generated by an apparatus having a pair of the opposing electrodes, at least one of which is covered with a solid dielectric. The plasma emerges between the dielectric and the opposing electrode, or between the dielectric and the opposing dielectric depending on the case.

The electrodes are made of a metal, such as copper, aluminum etc., an alloy such as stainless steel, bronze etc., or an intermetallic compound.

It is preferable that the pair of the opposing electrodes are designed so that the distance between them is approximately the same at all points in order to avoid arc discharge introduced by mal-distribution of electric field. Examples of the pair of the electrodes which satisfy this requirement are: parallel flat plates, paired cylindrical plates, paired spherical plates, paired paraboloidal plates and concentric cylinders.

The solid dielectric is mounted on the facing surface of one of the above mentioned electrodes. It is tightly adhered to the surface of the electrode and covers the entire facing surface of the electrode, in order to avoid arc discharge at exposed spots.

The solid dielectric may be plastics, such as polytetrafluoroethylene, polyethyleneterephthalate etc.; glass; metal oxide, such as silicon-dioxide, aluminum oxide, zirconium dioxide, titanium dioxide etc. or double oxide, such as barium titanate etc.

Configuration of the solid dielectric may be sheet or film, preferably having a thickness of 10 micron to 8 mm. A high voltage is required to generate discharge-plasma, when the thickness is too large. Dielectric breakdown takes place when the thickness is too small.

If the solid dielectric has a dielectric constant of 10 or higher, a high density discharge-plasma can be obtained at a relatively low voltage and a quick surface treatment or a fast continuous treatment can be performed. But if the dielectric has a dielectric constant of less than 10, a desirable treatment may not be performed. The upper limit of dielectric constant need not be specified. A material having a dielectric constant of 18,500 is known. The most preferred range of dielectric constant is 10 to 100.

Materials having a dielectric constant in this range are metal oxides, such as zirconium dioxide, titanium dioxide etc. and double oxides, such as barium titanate etc.

Titanates are known to have large dielectric constants. Titanium dioxide itself takes various value of dielectric constant depending upon the crystalline structure, e.g. the rutile type has a dielectric constant of about 80. A compound of $TiO_2$ combined with at least one of the oxides of Ba, Sr, Pb, Ca, Mg and Zr usually has dielectric constant of 2,000 to 18,500, though the purity and the crystalline structure affect the value.

Titanium dioxide itself greatly changes its structure when heated. If it is heated in a reducing atmosphere and consequently has oxygen deficiency, its application would be much restricted. For example, when it is made into a film by an ordinary method, it would have a volume resistivity of about $10^4$ Ω.cm, at which level arc discharge can be readily induced when the electric field is applied. To improve this tendency, it is recommended to add $Al_2O_3$ to $TiO_2$. A metal oxide film consisting of 5 to 50 wt. % titanium oxide and 50 to 95 wt. % aluminum oxide, is thermally stable and has better electric properties.

Therefore, it is highly desirable to specify that the above mentioned solid dielectric is a compound consisting of 5 to 50 wt. % titanium oxide and 50 to 95 wt. % aluminum oxide.

The film of the above compound is thermally stable and has a dielectric constant of 10 to 14 and a volume resistivity of $10^{10}$ Ω. cm, which is sufficient to prevent arc discharge. When the content ratio of aluminum oxide is less than 50 wt. %, the arc discharge tends to take place and if it exceeds 95 wt. %, the dielectric constant becomes to about 7, making it necessary to apply a high voltage to initiate electric discharge.

It is also desirable to have the solid dielectric in a form of covering a film of zirconium oxide having a thickness of 10 to 1,000 microns. The zirconium oxide, when used alone, gives a dielectric constant of about 12 and is suitable for generation of discharge-plasma at a relatively low voltage. It is a common practice to add yttrium oxide $Y_2O_3$, calcium carbonate $CaCO_3$ or magnesium oxide MgO, within 30 wt. % to zirconium oxide, in order to stabilize the compound against thermal expansion and contraction caused by a crystalline transformation. This practice is accepted in the present invention. The dielectric constant of this compound is decided by the added metal oxide and the crystalline structure, but it is desirable to maintain at least 70 wt. % of zirconium oxide. A desirable film of zirconium oxide containing 4 to 20 wt. % yttrium oxide shows a dielectric constant of 8 to 16.

The distance between the above mentioned electrodes is decided in consideration of the thickness of the solid dielectric, the magnitude of voltage to be applied, and the purpose of treatment etc. It is desirable to have a gap of 1 to 50 mm between the solid dielectric and the opposing electrode or the other opposing solid dielectric. A gap of less than 1 mm is not sufficient to place or carry the substrate to be treated, and a gap of more than 50 mm creates difficulty in getting uniformly distributed discharge-plasma.

FIGS. 2A-1 to 2A-4 shows waveforms of pulse modulated power voltage. Wave (1) and Wave (2) are impulse models. Wave (3) is a square model and Wave (4) is a modified model. FIGS. 2A-1 to 2A-4 shows an alternating power voltage which repeats positive peaks and negative peaks alternately, though a power having all peaks and valleys in the positive range or all in the negative range is also used.

The waveform of the pulse modulated power voltage is not limited to the examples shown here, but a short onset or offset time efficiently creates more ionization of the atmospheric gas.

It is the important point of this invention to limit the onset or offset time of the pulse to less than 100 microseconds, because when they exceed 100 microseconds, the discharge state becomes unstable and tends to change to an arc. Although a very short onset time is desirable, the practical range is limited to 40 nanoseconds deriving from device capability. The best practical range is 50 nanoseconds to 5 microseconds.

In this invention, the onset time is defined as the time in which the voltage continues to increase and the offset time as the time in which the voltage continues to decrease.

The power wave can be modulated by superimposing another pulse wave having a different waveform, a different onset time or a different frequency.

The desirable range of frequency of the pulse modulated electric field is from 0.5 to 100 kHz, preferably above 1.0 kHz. When the frequency is less than 0.5 kHz, the treating process takes a very long time and when it is more than 100 kHz, an arc discharge tends to take place.

Duration of pulse is preferred to be 1 to 1,000 microseconds. If it is less than 1 microseconds, the discharge becomes unstable and if it is over 1,000 microseconds, the discharge tends to transform to an arc. More particularly it is preferred to be 3 to 200 microseconds. The duration of pulse mentioned here is shown in FIG. 2B. It is the energized interval in a cycle of the pulse modulated electric field which alternates between an energized interval and a rest interval in a cycle.

The discharge takes place by applying a high voltage. The voltage should be properly selected and for the discharge-plasma treatment under the atmospheric pressure, a voltage that will give a field intensity of 1 to 100 kV/cm is applied. If the field intensity is less than 1 kV/cm, the treatment requires a long time and if it is over 100 kV/cm, an arc discharge tends to take place.

A direct current potential may be superimposed on the pulse modulated electric field.

The imposed electric field should be adjusted so that a preferred discharge current density of 0.2 to 300 mA/cm$^2$ is obtained. In this range, a uniform discharge-plasma produces desirable treatment results.

The discharge current density is defined as the current of discharge caused between the electrodes, divided by the area of discharge, perpendicular to the direction of the current. When the electrodes are parallel flat plates, it is the discharge current divided by the opposing area of the electrode. A pulse modulated electric field imposed between the electrodes would generate a pulse current. In the case of the pulse current, the discharge current density is the maximum value of the pulse current, i.e. the peak-peak value, divided by the above mentioned area.

Electron density in plasma, so called plasma density, is commonly measured by the probe method or by the electromagnetic wave method. But near the atmospheric pressure, the discharge between electrodes naturally has a tendency to become an arc discharge. Exact measurement is not expected by the probe method because the probe collects arc current at the time of measurement. It is also difficult to analyze plasma by the emission spectroscopy or the laser absorption analysis both using electromagnetic waves, because a sort of a gas in the field affects the reading.

In the glow-discharge near the atmospheric pressure, the density of a gas is greater than that of the low pressure discharge. Therefore, the life of ion, i.e. the time span between ionization and re-bonding, is short and the average free path of electron is short. This is the reason why the glow-discharge space is limited to the gap between the electrodes. The electron in plasma will be directly converted to the current of electrodes. It means that the plasma density is reflected in the discharge current density. It can be mentioned that the electrode functions as a kind of probe.

FIG. 3 shows an example of a discharge-plasma generator that the inventors used and a circuit diagram for the measurement of discharge voltage and current.

In the operation of this discharge-plasma generator, a pulse modulated electric field is formed by applying a pulse wave voltage in a magnitude of 1 kV between the opposing parallel flat electrodes 1 and 2 from the pulse power unit 3. On the opposing surface of the electrode 2, a solid dielectric 5 is disposed and a resister 10 is inserted in series between the electrode 2 and a ground wire. Both terminals of the resister 10 are connected to an oscilloscope 8 through a BNC terminal 7. The discharge current is calculated from the measured potential difference between both ends of the resister 10, and its resistance value. The discharge voltage is measured by connecting a high voltage probe 9 to the electrode 1, and then to the oscilloscope 8 through another BNC terminal 7. The high voltage probe 9 reduces the potential difference to one thousandth, which is then measured by the oscilloscope through the BNC terminal.

For this measurement, a high frequency oscilloscope of nanosecond reacting time was needed to read the very quick onset and offset of the discharge current induced by the pulse modulated electric field. An oscilloscope DS-9122 made by Iwasaki Communication Co. was used. The high voltage probe used for discharge voltage reduction was High Voltage Probe SK-301HV made by Iwasaki Communication Co. The result of the measurement is shown in FIG. 4. Waveform 1 indicates the pattern of discharge voltage and Waveform 2 indicates the pattern of discharge current. The discharge current density caused by the pulse modulated electric field is obtained by dividing the current (ampere) converted from peak-peak value of Waveform 2, by the area of opposing surface of the electrode.

In this invention, the above mentioned discharge current density of 0.2 to 300 mA/cm$^2$ is obtained by applying a specified pulse voltage between the opposing electrodes in the atmospheric pressure, yet with a large freedom in the selection of atmospheric gas, i.e. not choosing the sort of gas.

The time needed for the glow-discharge plasma treatment is adjusted in consideration of the applied voltage, the sort and the composition of the treating gas, the quality of the substrate, the purpose of treatment etc.

When the surface treatment of this invention is applied to low melting point materials, such as polymer materials, it is desirable to adjust the discharge current density to the range of 1 to 200 mA/cm$^2$ depending on the thickness of the dielectric, the dielectric constant, the field intensity between the electrodes, the distance between the electrodes, the purpose of treatment etc. If the discharge current density is less than 1 mA/cm$^2$, the discharge becomes unstable or the uniformly distributed glow-discharge is not generated, thus giving insufficient treating effect. If the discharge current density exceeds 200 mA/cm$^2$, the substrate to be treated is exposed to a very dense plasma and could suffer thermal distortion or degradation. Therefore, in the treatment under the discharge current density of 200 mA/cm$^2$ or more, it is preferred to conduct the treatment in less than 5 seconds or by cooling the substrate.

But if the substrate is a sheet of glass, silicon compound or other inorganic materials, cooling is not necessary, and on the contrary, heating may be helpful because it will promote the growth of thin film on the substrate.

In case the substrate is a dielectric or has a rough surface, streamers could appear during the discharge and may spoil the substrate. This problem could be solved by periodically providing 1 to 10 millisecond rest intervals in the pulse modulated electric field.

To provide rest intervals in the pulse modulated electric field, it is convenient to use another electric field having a frequency of 50 to 500 Hz and a duty ratio, i.e. Pulse Interval/(Pulse Interval+Rest Interval) of 20 to 70%.

If the duty ratio is less than 20%, the treatment takes a long time to make the process inefficient, and if the duty ratio is over 70%, the purpose of eliminating streamers would not be achieved. If the frequency is less than 50 Hz, the treatment takes a long time to make the process inefficient and if the frequency is over 500 Hz, the purpose of eliminating streamers would not be achieved.

FIG. 7 shows a block diagram of an example of a power source to impose the pulse modulated electric field and FIG. 8 shows an equivalent circuit diagram. SW's in FIG. 8 are semiconductor elements that function as switches. If a semiconductor element having a turn-on/turn-off time of less than 500 nanoseconds is used, it is possible to obtain a high voltage, high frequency pulse modulated electric field having a field intensity of 1 to 100 kV/cm and a onset/offset time of less than 100 microseconds.

The principle of the power source is briefly explained below with reference to the equivalent circuit diagram of FIG. 8.

+E is a positive DC power source and −E is a negative DC power source. SW1 to SW4 are switching elements comprising the above mentioned high speed semiconductor elements. D1 to D4 are diodes and $I_1$ to $I_4$ show the directions of current.

When at first SW1 is turned on, positive charge is carried in the direction of $I_1$ and subsequently at the instance of turning-off of SW1 and the following turning-on of SW2, the charge is carried through SW2 and D4 in the direction of $I_3$. Then, SW3 is turned on, following the turning-off of SW2, to carry a minus charge in the direction of $I_2$. SW3 is then turned off and instantaneously SW4 is turned on to carry the charge through SW4 and D2 in the direction of $I_4$.

The above sequence is repeated to obtain out-put pulse in a waveform of FIG. 9. Table 1 shows the sequence of this process.

TABLE 1

|      | 1   | 2   | 3   | 4   | 5   |
|------|-----|-----|-----|-----|-----|
| SW 1 | OFF | ON  | OFF | OFF | OFF |
| SW 2 | OFF | OFF | ON  | OFF | OFF |
| SW 3 | OFF | OFF | OFF | ON  | OFF |
| SW 4 | OFF | OFF | OFF | OFF | ON  |

The advantageous point of this circuit is in the facts that the discharge is assured to take place by discharging the accumulated charge through the action of SW2/D4 or SW4/D2 and that the quick action of the switching elements SW1 and SW3 warrants a high speed charging. These facts enable to obtain pulse signals having a very short onset/offset time as shown in FIG. 9.

The surface treatment process will be explained in details below.

The surface treatment of this invention is conducted by placing a substrate in a space between two opposing electrodes, at least one of the opposing surfaces thereof being covered with a solid dielectric, and exposing it to the discharge-plasma generated in the space.

The substrate which can be treated successfully by the process of this invention, is selected from the group of plastics, such as polyethylene, polypropylene, polystyrene, polycarbonate, polyethyleneterephthlate, polytetrafluoroethylene, acrylic resins etc.; glass; ceramics and metals. The configuration of the substrate is often plate or film, but is not limited to them because the present method can be readily applied to a substrate of various forms and shapes.

The present method of the treatment provides any kind of surface modification, by properly selecting the gas atmosphere for the space of discharging plasma. (Hereinafter the gas is called 'treating gas', whether or not diluted with an carrier gas.)

If a fluorine containing compound gas is used as the treating gas, it is possible to obtain a water repellent surface owing to the fluoro-compound created on the surface which lowers the surface energy.

The fluoro-compound is selected from the group of carbon, i.e. tetrafluoride ($CF_4$), hexafluoroethane ($C_2F_6$), hexafluoropropylene ($CF_3CFCF_2$), octafluorocyclobutane ($C_4F_8$), other fluorocarbon compounds, monochlorotrifluorocarbon ($CClF_3$), other halogen-carbon compounds, sulferhexafluoride ($SF_6$) and other fluoro-sulfur compounds. From the safety point of view, it is preferred to use carbon tetra-fluoride, hexafluoroethane, hexafluoropropylene or octafluorocyclobutane, all of which do not generate hazardous hydrogen fluoride gas.

By using, as the treating gas, an oxygen containing compound, a nitrogen containing compound or a sulfur containing compound described below, the surface of the substrate can be modified to be hydrophilic, which adds functional groups such as carbonyl, hydroxyl and amino groups which raise the surface energy.

The above mentioned oxygen containing compounds are: oxygen, ozone, carbon monoxide, carbon dioxide, nitrogen dioxide; alcohols, such as methanol or ethanol; ketones, such as acetone and methyl ethyl ketone; aldehydes, such as methanal and ethanol. These can be used alone, or combined in two or more. Also, the above oxygen containing compounds can be used in combination with hydrocarbon gases, such as methane and ethane.

The hydrophilic treatment is accelerated by adding less than 50 vol. % fluorine containing compound to the above oxygen containing compound. The fluorine containing compound is chosen from the above mentioned group.

The above nitrogen containing compounds are nitrogen gas and ammonium gas. Hydrogen may be mixed with these compounds.

The above sulfur containing compounds are sulfur dioxide and sulfur trioxide. Sublimated sulfur may also be used. These can be used alone or combined in two or more.

If the treatment is conducted in a gas atmosphere containing a monomer which has hydrophilic group(s) and polymerizable unsaturated bond(s) within the molecule, a hydrophilic polymer film can be deposited on the substrate. The hydrophilic groups are: hydroxy group, sulfonic group, sulfonate group, primary/secondary/tertiary amino group, amide group, quaternary ammonium salt group, carboxylic group and carboxylate group. A similar hydrophilic polymer film can be deposited by using a monomer which has a polyethylene glycol chain in the molecule. Therefore, the unsaturated monomer is selected from the group of acrylic acid, methacrylic acid, acrylamide, methacrylamide, N,N-dimethyl acrylamide, sodium acrylate, sodium methacrylate, potassium acrylate, potassium methacrylate, styrene sodium sulfonate, allyl alcohol, allyl amine, polyethylene-glycol dimethacrylate, polyethyleneglycol diacrylate etc. These monomers may be used alone or combined in two or more.

The above hydrophilic monomers are often solid. Vaporization is caused by dissolving them in a solvent and atomizing it under a low pressure. The solvent is methanol, ethanol, acetone, another hydrophilic organic solvent, water or a mixture of them.

Inorganic thin film of metal oxide, metal nitride, metal carbide etc. is deposited on the substrate when a compound containing Si, Ti, Sn or other metal is used as the treating gas, thereby providing some electronic or optical function to the substrate surface.

The metal containing compound is: an organic metal compound, such as dimethyl silane $Si(CH_3)_2H_2$, tetramethyl silane $Si(CH_3)_4$, or tetradimethylamino titanium $Ti(N(CH_3)_2)_4$; a metal-hydrogen compound, such as monosilane $SiH_4$, or disilane $Si_2H_6$; a metal halide, such as silane dichloride $SiH_2Cl_2$, silane trichloride $SiHCl_3$ or titanium chloride $TiCl_4$; or a metal alkoxide, such as tetramethoxy silane $Si(OCH_3)_4$, tetraethoxy silane $Si(OC_2H_5)_4$ or tetraisopropoxy titanium.

With regard to the safety, it is preferred to use metal alkoxides or metal halides which do not ignite or explode in the atmosphere. It is further preferred to use alkoxides which do not emit any corrosive gas or hazardous organic gas.

The mentioned metal compounds in gaseous state can be introduced into the discharge space but ones in liquid phase have to be carried through a vaporizing apparatus before being introduced into the discharge space. The preferred metal compounds are, for the practical reasons, tetraethoxy silane, tetraisopropoxy titanium etc. which are liquid at room temperature having a boiling point lower than 200° C.

The metal alkoxides mentioned above may be diluted by a solvent, such as methanol, ethanol, n-hexane or the like, or mixture of them. These diluting solvents are decomposed to atomic state when exposed to a glow-discharge, so that their influence on the thin film-deposition is negligible.

In the art of the plasma treatment at an atmospheric pressure under the existence of helium, only low density plasma can be obtained and the deposition of an inorganic thin film derived from a metal-containing compound was not obtained. The present method of high density plasma, for the first time, made it possible to synthesize an inorganic thin film by plasma treatment in the atmospheric pressure.

With regard to the economy and the safety, it is preferred to conduct the treatment in a treating gas diluted by an carrier gas. The carrier gas is a rare gas such as helium, neon, argon, xenon or the like, or nitrogen. These can be used alone or in combination of two or more.

In the art, the treatment under the existence of helium gas under atmospheric pressure has been conducted but in the present invention, a more economical argon gas and/or nitrogen gas is used to achieve a stable treatment to thereby provide a great commercial advantage.

As mentioned above, a stable glow-discharge is obtained in the gas atmosphere containing more than 50 wt. % gas of 10 or more MW. By selecting a dilution gas of larger molecule than helium in MW, such as neon, argon, xenon or nitrogen, a very fast and highly functioned treatment is conducted in a high density plasma.

In a second aspect of the present invention, an apparatus for a glow-discharge plasma treatment comprises (a) two opposing electrodes; (b) a solid dielectric disposed on the surface of at least one of the electrodes; and (c) a high voltage pulse power unit which generates an electric field that is pulse modulated in a manner such that onset time, preferably offset time as well, of a pulse is less than 100 $\mu$s. The power unit comprises a high voltage direct current source and a pulse controller converting high voltage direct current to high voltage pulses by means of semiconductor elements having a turning-on time or a turning-off time of less than 500 nanoseconds.

In this embodiment, an apparatus as shown in FIG. 1 explained before may be used. In this apparatus, a dielectric 16 is disposed on a lower electrode 15, and a discharge-plasma is generated in a space 13 between the dielectric 16 and an upper electrode 14. A chamber 12 is provided with a gas inlet pipe 18, a gas outlet pipe 20 and an exhaust duct 21, and a treating gas is fed through the gas inlet pipe 18 to the plasma discharge space 13. In this invention, the part of a substrate 17 contacted by the discharged plasma is treated. Thus, the upper surface of the substrate 17 in FIG. 1 is treated. When the treatment on both sides of the substrate is desired, it is located in the middle of the discharge space 13.

It is preferable to spread the treating gas uniformly in the plasma discharge space. When the treatment is conducted in a mixture of a treating gas and an carrier gas, it is preferable to have a device which prevents uneven diffusion of the gas caused by the mass difference between the heavy treating gas and the light carrier gas. Especially, a large substrate requires this caution. In the apparatus of FIG. 1, the gas inlet pipe 18 is connected to the electrode 14 having many gas outlet holes, through which the treating gas is ejected to the plasma space 13. The carrier gas is fed through a separate carrier gas pipe 19. This device may be replaced by another device which causes a stirring or jetting action in the case where the treating gas and the carrier gas are pre-mixed homogeneously.

The material of the chamber 12 is, for example, a plastic or a glass, but it is not limited to them. When the chamber is made of a metal, such as stainless steel or aluminum, it must be electrically separated from the electrodes.

A plasma treatment method of another aspect of the present invention is one application of the glow-discharge plasma treatment induced by a quick onset or offset pulse field. The method comprises (a) providing two opposing electrodes, at least one of opposing surfaces thereof being covered with a solid dielectric, in a closed treating chamber having an entrance and an exit for web feeding which are not completely air-tight but allow a leakage of a gas; (b) continuously feeding a substrate in a web form through the entrance of the treating chamber, guiding the web between the two electrodes and hauling the web off through the exit of the treating chamber; (c) contacting the web with a counter-flowing treating gas in the treating chamber; and (d) simultaneously imposing an electric field between the opposing electrodes which is pulse modulated in a manner such that onset time, preferably offset time as well, of a pulse of the electric field is less than 100 $\mu$s and the field intensity is 1 to 100 kV/cm.

In the present invention, the web to be treated is fed continuously to the treating chamber, guided to the space between the opposing electrodes and hauled from the chamber. The feeding and hauling of the web are conducted by any known method. In the present invention, the pressure in the treating chamber is kept near the atmospheric pressure, and the entrance and the exit of the web are not completely air-tight to permit the leakage of the gas, because the glow-discharge is stably maintained and not disturbed by the intrusion of a small amount of air, so that it is unnecessary to seal the chamber air-tightly to prevent leakage of the inner gas or intrusion of air.

In the continuous treatment of the web, the treating gas in the discharge space between the electrodes provides a wide range of treating effect depending on the kind.

In the present invention, the web is fed continuously to the space between the opposing electrodes and simultaneously the treating gas is supplied to the chamber. The gas is ejected continuously towards the web in the counter-direction against the movement of the web. The action of the gas stream reduces the amount of air engulfed by the web into the plasma discharge space. A large amount of intruding air might damage the treating capability of the gas by changing the gas formulation best suited for a particular treatment, though the electric discharge itself would not be damaged. The counter flow will be explained in detail, later by examples.

The preferred examples of the following factors in the web treatment are the same as the ones described before: onset or offset time in the pulse modulated electric field, field intensity, discharge interval in a cycle, frequency of modulated wave, high voltage pulse power to impose electric field, treating gas, and dielectric.

In another aspect, the invention provides an apparatus for the glow-discharge plasma treatment, which comprises (a) two opposing electrodes, at least one of opposing surfaces thereof being covered with a solid dielectric, the electrodes being located in a closed treating chamber having an entrance and an exit for web feeding which are not completely air-tight to allow leakage of a gas, and being provided so as to enable a substrate in a web form to travel the space between the electrodes continuously; (b) gas spout(s) in the treating chamber to generate a counter-flow of the treating gas against the traveling web; and (c) a high voltage pulse power unit to impose an electric field between the opposing electrodes, the electric field being pulse modulated in a manner such that onset time, preferably offset time as well, of a pulse of the electric field is less than 100 $\mu$s, and field intensity is 1 to 100 kV/cm.

FIG. 15 is a schematic sectional view showing an example of the continuous web treating apparatus. The apparatus of FIG. 15 comprises a power source 51, a treating chamber 52, an upper electrode 53, a lower electrode 54, a gas flow generator 55 having a turbo-blower, a substrate in a web form 56, a web entrance 57, a web exit 58, a dielectric 59, a gas inlet pipe 60, a gas outlet pipe 61, a dielectric side wall 62, a gas passage 63, and a system to handle the web. The solid dielectric wall is erected to surround the plasma discharge space between the opposing electrodes and along the passage of the web to prevent the treating gas from diffusing away.

FIG. 15 shows only one pair of electrodes, but the desired number of pairs may be installed to elongate the path of the plasma contact for the web 56 in order to accelerate the processing speed. FIG. 16 shows an example of a treating apparatus having many pairs of electrodes. It is possible to feed a different treating gas to each gap of the opposing electrodes for the purpose of providing a multilayer deposition.

The material of the chamber 52 is not specified but may be the same as for the above mentioned chamber 12. In the treating chamber 52, on both ends, the entrance 57 and the exit 56 are provided for the travel of the web 56. The web 56 is fed in and taken out by pairs of rollers installed outside the chamber 52, through the entrance 57 and the exit 58. The entrance 57 and the exit 58 are loosely sealed to the extent that the treating gas inside the chamber 52 is allowed to escape very slowly, and preferably, it is equipped with a pump or the like to ventilate the gas continuously but very slowly.

The glow-discharge plasma treatment apparatus of FIG. 15 is provided with a gas flow mechanism to eject the treating gas to the surface of the web 56 in the opposite direction of the web movement to cause a continuous contact of the gas with the web. Several embodiments of this gas flow mechanism are shown in FIG. 15, FIG. 17, FIG. 18, FIG. 19, FIG. 20 and FIG. 21. FIG. 15 shows a gas flow generator having a pump or a blower 55 to circulate the treating gas in the space between the electrodes in the direction towards the web entrance from the exit. FIG. 17 shows a gas feeding nozzle 64 which ejects the treating gas. FIG. 18 shows a gas reservoir 65 in the electrode facing the web, having slanting outlet holes through which the treating gas is ejected in a designed direction. FIG. 19 shows a suction inlet near the electrode edge on the entrance side, through which the gas is drawn by a pump 66. FIG. 20 shows a gas outlet near the electrode edge on the exit side, through which the gas is blown by a pump or a blower 66. FIG. 21 shows a fan 67 which creates gas flow.

The gas flow generator 55 of FIG. 15 is much preferred because this device reduces the gas flow reaching and reflecting at the end wall of the treating chamber and enables the recycling of the gas.

In a device 55, a fast and even gas flow is created if it has a slit-shaped gas ejector on the exit side of the treating space and a larger mouth gas drawer on the entrance side of the treating space. The consumption efficiency of the gas is increased by recirculation.

To assist the smooth flow of the gas, a solid dielectric side wall may be provided on the other side of the web where the gas flow is not created.

In FIG. 15, the gas flow is created on one side of the web 56 but when both surfaces of the web are to be treated, the gas flow is created on both sides of the web.

A sensor for a gas density detection may be installed as needed in the gas passage 63 to control the gas density. Or a gas separator to remove a useless gas may be installed in the gas passage 63 to control the purity of the treating gas.

The treating gas is introduced into the treating chamber 52 through the inlet pipe 60 under a controlled flow rate. It is recommended to feed the gas to the chamber 52 after blending well the diluted or mixed gas in considering the differences in flow rate and the mass of molecule.

An excess treating gas in the chamber 52 is discharged through the outlet pipe 61 to the atmosphere or to the chamber 52 for recycling.

The flow rate of the treating gas fed from the gas flow generator is adjusted according to the web traveling speed, the air-tightness of the web entrance, the quality of the web etc. It is preferred to adjust the gas velocity higher than the web traveling speed.

In another aspect, the invention provides a glow-discharge plasma treatment method, which is one of the applications of the second aspect in which the pulse modulated electric field has a very short pulse onset/offset time. This method comprises (a) providing a gas reservoir made of a solid dielectric, which has a gas outlet opening and an electrode mounted near the gas outlet opening; (b) providing another electrode which opposes the gas outlet opening; (c)

placing a substrate between the gas outlet opening and the opposing electrode; (d) continuously ejecting a treating gas from the gas outlet opening; and (e) imposing an electric field between the two electrodes, which is pulse modulated in a manner such that onset time, preferably offset time as well, of a pulse of the electric field is less than 100 μs and field intensity is 1 to 100 kV/cm.

In another aspect, the invention provides a glow-discharge plasma treatment apparatus, which comprises (a) a gas reservoir made of a solid dielectric, which has a gas outlet opening to eject a treating gas continuously and an electrode mounted near the gas outlet opening; (b) another electrode which opposes the gas outlet opening; and (c) a high voltage pulse power unit to impose an electric field between the two electrodes which is pulse modulated in a manner such that onset time, preferably offset time as well, of a pulse of the electric field is less than 100 μs and field intensity is 1 to 100 kV/cm.

The present inventions are described below in detail, referring to the drawings.

FIG. 22 shows a sectional schematic diagram of an example of the glow-discharge plasma treatment apparatus. In FIG. 22, 71 is the power source. 72 is an electrode on the gas reservoir and 73 is the other electrode. 74 is a gas reservoir made of a solid dielectric. 75 is a substrate to be treated. 76 is a gas inlet duct to feed the gas to the solid dielectric reservoir. 77 is a gas outlet opening. 78 is a device to connect the electrode 72 and the other electrode 73, mechanically.

In the invention, plasma is also generated in the solid dielectric reservoir 74 which is filled with the treating gas, by imposing an electric field between the electrode 72 and the electrode 73. The gas in the solid dielectric reservoir 74 is ejected toward the substrate 75 through the gas outlet opening 77. The component of the treating gas excited to a plasma state contacts the surface of the substrate 75 and modifies the surface. The spot of a treatment on the substrate can be shifted by changing the relative position of the substrate 75 and the solid dielectric reservoir 74. This method makes it possible to treat a large area substrate or the limited area on the substrate by using a simple apparatus and a small amount of a treating gas.

The power source 71 is designed to impose an electric field having the same onset or offset time and the field intensity as in the first aspect of the invention, by applying the same high voltage pulse power. The duration of pulse in a cycle and the frequency are in the same preferred range as in the first aspect of the invention.

The configuration of the electrodes 72 and 73 is not limited to the flat shape shown but may be cylinders, paired spherical plates or other curved plates.

The materials for the electrodes 72 and 73 are the same as disclosed in the first aspect of the invention.

The distance between the center of the gas outlet opening 77 of the solid dielectric reservoir 74 and the other electrode 73 is adjusted according to the thickness and quality of the solid dielectric reservoir 74, the thickness and the quality of the substrate 76, the magnitude of the applied power voltage etc., though the preferred distance is 1 to 30 mm. If it is less than 1 mm, it is difficult to place the substrate and if it is more than 30 mm, the generation of discharge-plasma requires a high voltage which tends to generate arc discharge, and consequently an even surface treatment is not obtained.

The configuration of the solid dielectric reservoir 74 may be a cubic or rectangular box, a cylinder or a sphere, but is not limited to them. The sort and the quality of the dielectric are the same as those disclosed in the first aspect of the invention.

The electrode 72 is located on the solid dielectric reservoir 74. FIG. 23 and FIG. 24 show other examples of the location of the electrode on the reservoir.

When the solid dielectric reservoir 74 has a rectangular shape, the electrode 72 may be located on a side other than the side where the gas outlet opening is located.

The wall thickness of the solid dielectric reservoir 74 at the point of the electrode 72, is preferably 0.03 mm to 30 mm. If it is less than 0.03 mm, a dielectric breakdown occurs when a high voltage is applied to create an arc discharge.

The solid dielectric reservoir 74 is provided with the gas inlet pipe 76 and the gas outlet opening 77. The design of the gas outlet opening 77 may be a slit-shaped opening, a group of holes or a protruding nozzle made of the same dielectric but it is not limited to them. FIG. 25, FIG. 26 and FIG. 27 show examples of the gas outlet openings 77.

The solid dielectric reservoir can be designed to hold the gas in itself instead of being fed by the inlet duct shown in FIG. 25. For example, a liquid is held inside the reservoir, and is evaporated as a treating gas before being ejected.

The device 78 of FIG. 22 is capable of freely adjusting the distance between the gas outlet opening 77 and the other electrode 73. By this device 78, a large area substrate 75 can be treated by traversing between the gas outlet opening 77 and the other electrode 73 without changing the mutual distance and position. Even a molded substrate can be treated by continuously changing the distance between the opening 77 and the electrode 73 to follow the contour of the molded substrate, continuously or partially.

But if the distance between the gas outlet opening 77 and the substrate 75 is too long, the substrate has more chance to contact air, and the treatment may not be completed.

In this invention, the treating gas is ejected continuously from the gas outlet opening 77 of the solid dielectric reservoir. When some kinds of the treating gas are blended or the gas is diluted by an carrier gas, each gas is metered by a standard gas flow regulator which is not shown in FIG. 22, and the gases are blended before fed into the dielectric reservoir 74 through the inlet pipe 76.

The gas volume and the flow velocity at the outlet opening 77 are properly controlled by considering the cross section of the hole 77, the distance between the substrate 75 and the opening 77 etc. For example, a gas feeding volume of 5 standard liter per minute (slm) is proper and an outlet flow velocity of 830 mm/sec is proper for an opening having a cross section of 100 mm$^2$. By increasing the gas feeding volume, the outlet flow rate is proportionately increased and the time of the treatment is shortened.

The treatment gas used in this invention is the same as the one used in the first aspect of the invention.

A still another aspect of the invention resides in a glow-discharge plasma treatment method, which is one application of the third aspect, wherein a pulse modulated electric field has a short onset or offset time. The method comprises: placing a substrate in a space formed by two opposing electrodes and surrounding walls made of a dielectric, the space being filled with a treating gas; and exposing the substrate to a plasma which is generated by an electric field imposed between the electrodes near the atmospheric pressure, the electric field being pulse modulated in a manner such that onset time or offset time of a pulse of the electric field is less than 100 μs and the field intensity is 1 to 100 kV/cm.

In another aspect, the invention provides a glow-discharge plasma treatment apparatus, which comprises (a) a treating space defined by a pair of horizontally installed electrodes and vertically installed walls made of a solid dielectric, surrounding the electrodes; (b) inlet pipes for a treating gas and outlet pipes to ventilate the treating space; and (c) a high voltage pulse power unit to impose an electric field between the two electrodes, the electric field being pulse modulated in a manner such that onset time, preferably offset time as well, of a pulse of the electric field is less than 100 μs, and the field intensity is 1 to 100 kV/cm.

The present invention is described below in detail with reference to the drawing. FIG. 28 is a schematic sectional view showing an example of the glow-discharge plasma treatment apparatus used in the present invention.

The apparatus comprises a power source unit 81, an upper electrode 82, a lower electrode 83 and solid dielectric walls 84*a* and 84*b*. The upper electrode 82 is horizontally installed in parallel with the lower electrode 83, and the solid dielectric walls 84*a* and 84*b* are installed vertically to surround the space between the two electrodes to thus form a treating space 91. The treating space need not have a rectangular or cubic shape but may be a cylinder.

The plasma discharge treatment is conducted onto the substrate placed in the treating space 91 defined by the upper electrode 82, the lower electrode 83 and the solid dielectric side walls 84*a* and 84*b*. A partial treatment of the substrate 86 larger than the treating space 91 is achieved by clamping the substrate between the dielectric walls 84*a* and 84*b* so that the desired treatment spot of the substrate is located inside the treating space 91, and generating a plasma.

The upper electrode 82 and the lower electrode 83 are mounted to electrode holding arms 85 via insulators 89, and the substrate 86 is clamped by the dielectric walls 84*a* and 84*b* at their meeting point by manipulating the holding arms 85.

Such a structure enables a relatively small apparatus to treat a large substrate consecutively place by place, by changing its relative position to the substrate.

FIG. 28 shows a horizontally positioned pair of electrodes 82 and 83, but beside this flat parallel pair, other arrangements may be used, such as cylindrically curved pair, spherically curved pair, paraboloidally curved pair or concentric cylinders.

The distance between the upper electrode 82 and the lower electrode 83 is properly adjusted according to the thickness of the solid dielectric, the thickness of the substrate, the magnitude of the applied voltage etc. However, if the electrode distance exceeds 30 mm, the discharged plasma tends to transform to arc to thereby provide an uneven treatment which is not desirable.

When the substrate is a conductive material like a metal, or a porous material, the opposing surface of the electrode should preferably be covered with a solid dielectric (not shown in the diagram). It is sufficient to cover one electrode only, but both may be covered.

The treating gas which will be described later is led into the treating space 91 and air in the space is displaced by the gas and kept under or near the atmospheric pressure.

The flow rate controlled gas can be directly fed into the treating space 91 through the gas inlet ducts 87*a* and 87*b*, or may be fed into the reservoir of the electrode and then into the treating space. In the example of FIG. 28, the opposing surfaces of the electrodes are provided with many holes 90 through which the gas is fed into the treating space 91. These holes provide an even distribution of the gas especially suited for a large treating space or a complex-shaped treating space.

The treating gas may be fed into the treating space 91 through inlet pipes mounted in the solid dielectric walls 84*a* and 84*b*.

The excess treating gas is exhausted through the gas outlet pipes 88 mounted in the solid dielectric walls 84*a* and 84*b*. The exhausted gas is diffused into the atmosphere or recycled to the treating space. The solid dielectric walls may be made porous so that the excess treating gas can seep out, or the walls may have many outlet holes.

In the glow-discharge plasma treatment of the present invention, the preferred pulse modulated electric field has the same voltage, onset or offset time, field intensity, duration of pulse in a cycle and frequency as mentioned before. The preferred pulse power source, the treating gas and the solid dielectric are the same as mentioned above.

BRIEF DESCRIPTION OF THE DRAWINGS

FIGS. 2A-1 to 2A-4 are waveform graphs showing examples of the pulse modulated electric field;

FIG. 3 is a diagram explaining an example of a measuring circuit of the discharge voltage and the discharge current used in the present invention;

FIG. 4 is a graph showing an example of the observed waveforms of the discharge voltage and the discharge current;

DETAILED DESCRIPTION OF PREFERRED EMBODIMENTS

The present invention will now be described further in detail with reference to embodiments.

Figure 8:
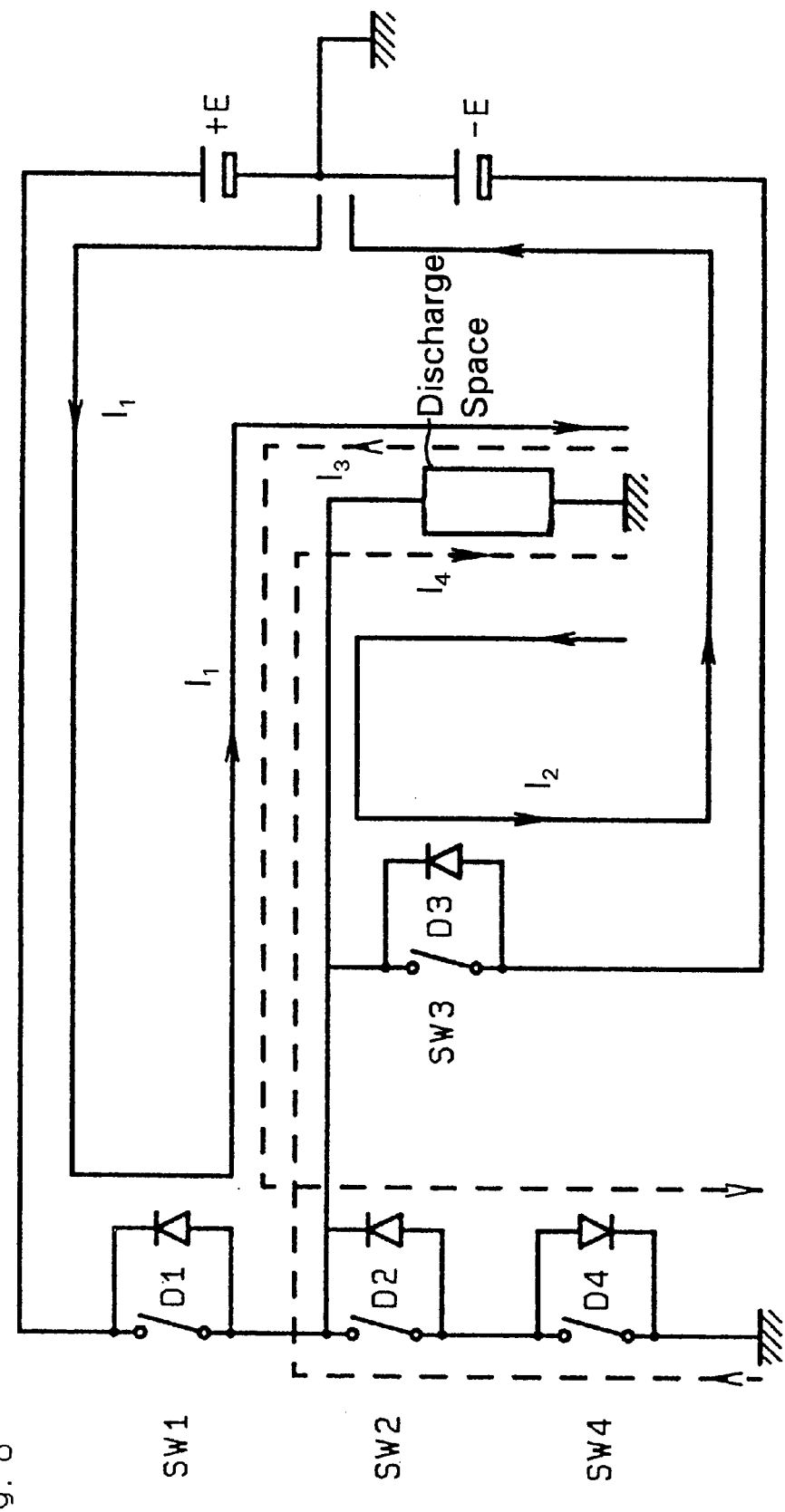
FIG. 8 is an equivalent circuit diagram of the pulse power unit.
Figure 9:
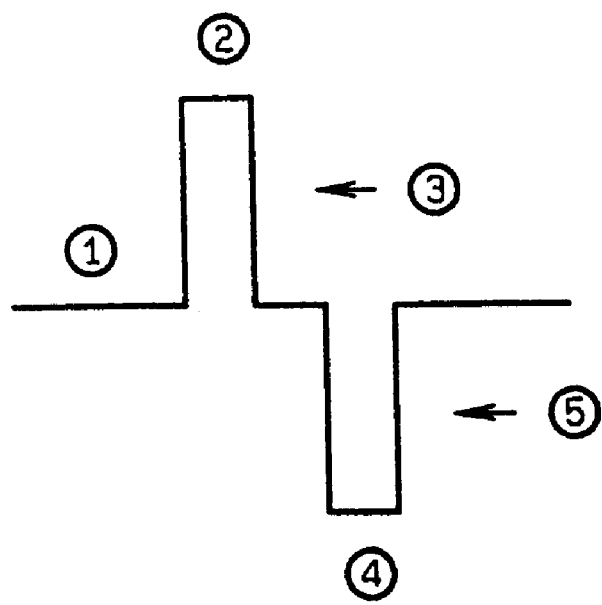
FIG. 9 is a diagram showing a model pattern of the output pulse according to the switching sequence of Table 1.

In the following examples, a pulse power unit of Model TO-247AD manufactured by Haiden Labo. Co. which utilizes semiconductor elements made by IXYS Corp. and has an equivalent circuit as shown in FIG. 8 was used.

EXAMPLES 1, 2, 3 and 4

Figure 1:
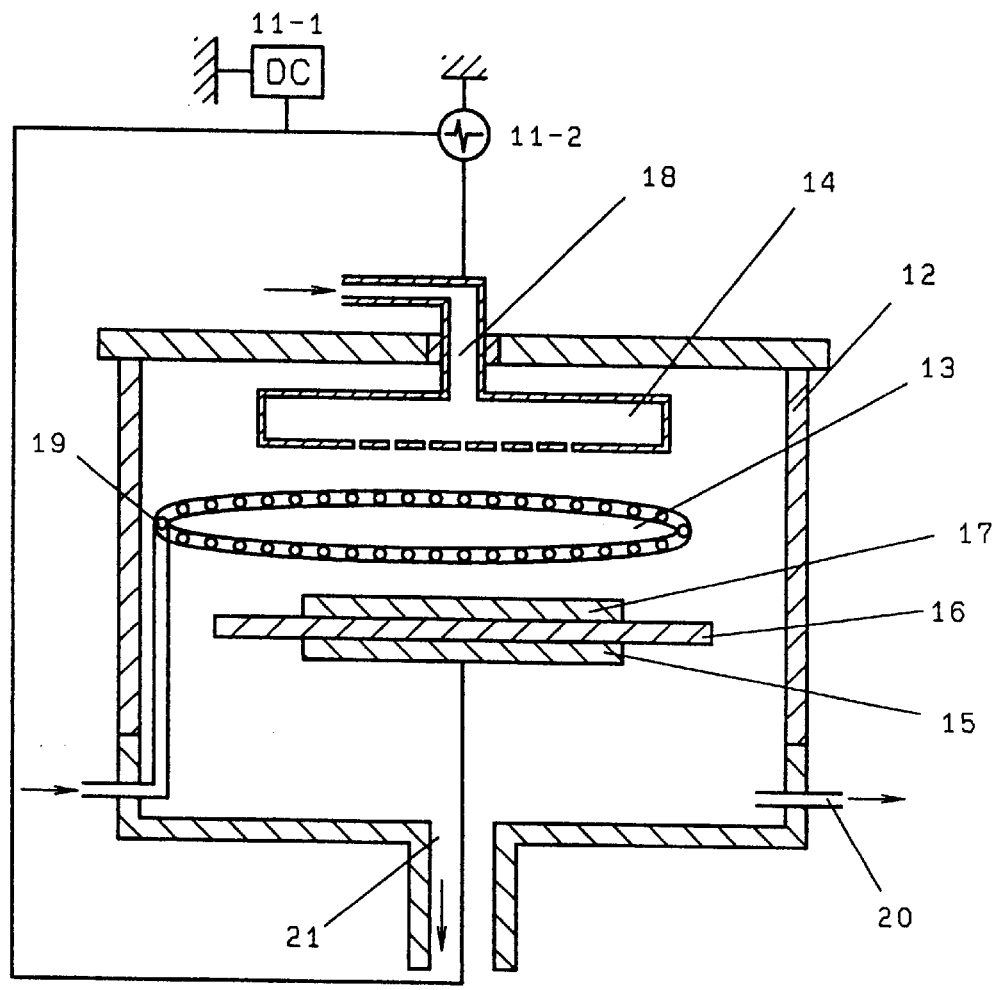
FIG. 1 is a schematic sectional view showing an example of a plasma treatment apparatus used in the present invention.

In the chamber 12 of FIG. 1 which was made of Pyrex glass and had 5 liter volume, an upper electrode 14 made of stainless steel (SUS304) having a size of $\phi 80 \times 10$ mm and holes of $\phi 1$ mm at every 10 mm, and a lower electrode 15 made of stainless steel (SUS304) having a size of $\phi 80 \times 10$ mm are installed to have a 6 mm gap between them. A dielectric of polytetrafluoroethylene 16 having a dielectric constant of 2.5, a size of 120×120 mm and a thickness of 500 micron is placed on the lower electrode 15 to cover the whole surface. On this dielectric, a polyethyleneterephthalate film of Lumirror T50 made by Toray Industries, Ltd. (hereinafter PET film) and having a size of 100×100 mm and a thickness of 50 micron was placed. Air inside the chamber was drawn to 1 Torr by an oil rotary pump. Then, a nitrogen gas was introduced to the chamber through the gas inlet pipe 19 to gain a pressure of 760 Torr. A pulse modulated electric field having the waveform, the peak value, the frequency, the pulse duration and the onset/or offset time shown in Table 2 was imposed for 15 seconds between the electrodes 14 and 15, in order to generate discharge-plasma and treat the PET films.

The waveform (4) of Example 4 was synthesized from the waveform (3) having a frequency of 1.0 kHz and a pulse duration of 800 microseconds, and is modulated by a waveform having a frequency of 20 kH and a pulse duration of 20 microseconds.

The plasma generated in the examples 1 to 4 were all in a glowing state which has a characteristic of the glow-discharge. The treated effect was evaluated by the contact angle measurement, as shown in Table 2

EXAMPLE 5, 6, 7 and 8

In the apparatus of Example 1, a substrate made of silicate glass having a dimension of 100 mm×100 mm×2 mm was placed on the dielectric covered lower electrode 15. The inside air was drawn to 1 Torr by an oil rotary pump. Each of the treating gas shown in Table 2 was introduced to the chamber through the gas inlet pipe 18 and simultaneously the argon gas was fed through the carrier gas inlet pipe 19 at the mixing ratio and the flow rate shown in Table 2 till the pressure became 760 Torr, and then the gas exhaust duct 21 was opened to continue the gas flow. The pulse modulated electric field which has the waveforms, the peak values, the frequencies, the pulse duration, the onset/offset time shown in Table 2 was imposed for 1 minute to generate plasma, to treat the surface of the substrates.

In all the cases of Examples 5 to 8, the generated plasma showed a uniformly dispersed glow state which had a characteristic of the glow-discharge. The treated effect was evaluated by the contact angle measurement, as shown in Table 2.

Interferogram was observed in the treated specimens. No silicon element originating from the substrate was observed on the surface, by the X-ray photo-electron spectroscopy (XPS). This result indicates that the plasma deposited layer existed to a depth of over 100 micron which is the detection limit of the XPS.

In Example 7, the discharge was generated by a high voltage pulse power which was synthesized from the waveform (1) by superimposing −1 kV DC potential.

EXAMPLES 9 and 10

In the apparatus of Example 1, a PET substrate of Lumirror T-50 made by Toray Industries, Ltd. and having a dimension of 100 mm×100 mm×50 micron was placed on the dielectric sheet 16 of quartz glass having a dielectric constant-of 5 and a dimension of 100 mm×100 mm×3 mm.

The inside air was drawn to 1 Torr by an oil rotary pump. Each of the treating gas shown in Table 3 was introduced to the chamber through the gas inlet pipe 18 and simultaneously the nitrogen or the argon gas was fed through the carrier gas inlet pipe 19 at the mixing ratio and the flow rate shown in Table 3, till the pressure became 760 Torr, and then the gas exhaust duct 21 was opened to continue the gas flow. The pulse modulated electric field which has the waveforms, the peak values, the frequencies, the pulse duration, the onset/offset time shown in Table 3, was imposed for 15 seconds to generate plasma to treat the surface of the substrates.

In the cases of Examples 9 and 10, the generated plasma showed a uniformly dispersed glow state which has a characteristic of the glow-discharge. The treated effect was evaluated by the contact angle measurement, as shown in Table 3.

EXAMPLES 11 and 12

An oxide film consisting of 13% titanium dioxide and 87% aluminum oxide and having a thickness of 500 micron and a dielectric constant of 14 was formed by the thermal sprayed coating, on one surface of a carbon steel plate of SS41 having a dimension of 140 mm×140 mm×10 mm.

In the apparatus of Example 1, on the lower electrode 15, the above carbon steel plate was placed with the coated face opposing the upper electrode 14. A substrate of PET, Lumirror T-50 made by Toray Ind., Ltd. having a dimension of 100 mm×100 mm×50 micron was placed on the above coated plate.

The inside air was drawn to 1 Torr by an oil rotary pump. Each of the treating gas shown in Table 3 was introduced to the chamber through the gas inlet pipe 18 and simultaneously the nitrogen or the argon gas was fed through the carrier gas inlet pipe 19 at the mixing ratio and the flow rate shown in Table 3 till the pressure became 760 Torr, and then, the gas exhaust duct 21 was opened to continue the gas flow. The pulse modulated electric field which has the waveforms, the peak values, the frequencies, the pulse duration, the onset/offset time shown in Table 3, was imposed for 15 seconds to generate plasma to treat the surface of the substrates.

In the cases of Examples 11 and 12, the generated plasma showed a uniformly dispersed glow state which has a characteristic of the glow-discharge. The treated effect was evaluated by the contact angle measurement, as shown in Table 3.

Reference 1

A reference specimen was obtained under the same conditions of Example 1 except that the applied AC voltage was in a sine waveform having a peak value of 8.4 kV and a frequency of 2.4 kHz instead of the pulse modulated form of Example 1. Many streamers were observed in the treated sample indicating an ununiformly distributed discharge.

Evaluation by contact angle

Static contact angle was measured by dropping 2 microliter water on the specimens of Example 1 to 12 and Reference 1. The angles were measured by the contact angle meter CA-X150 manufactured by Kyowa Interface Science, Ltd. The results are shown in Table 2 and 3.

The specimens of Examples 1 to 4 treated under the nitrogen gas atmosphere and the specimen of Example 8 treated under the methanol gas atmosphere constantly exhibited a low contact angle in all the area showing a good hydrophilic surface. The specimens of Examples 5 to 7 treated under the fluorocarbon atmosphere constantly exhibited a high contact angle in all the area, which show a good water repellent surface. The specimen of Reference 1 on which an ununiformly distributed discharge was observed, exhibited varying angles of 40 to 60 degrees indicating uneven treatment.

Examples 9 to 12 in which fast onset/offset pulses were imposed exhibited high level treatments.

EXAMPLE 13

The chamber of FIG. 1 of 1 liter volume made of Pyrex glass was provided with an upper electrode 14 of stainless steel SUS 304 having a dimension of φ140×10 mm and many φ1 mm holes in every 5 mm interval, and a lower electrode 15 of stainless steel SUS 304 having a dimension of φ140×10 mm. The opposing surfaces of the disk electrodes were coated with a solid dielectric compound consisting of 92% zirconium oxide and 8% yttrium oxide, which had a dielectric constant of 16 and a thickness of 500 micron. In this example, the dielectric sheet 16 was absent. The distance between the electrodes was adjusted to 2 mm, where a PET substrate of Lumirror T50 made by Toray, Ind., having a dimension of 100 mm×100 mm×50 micron, was placed.

The inside air was drawn to 0.1 Torr. The argon gas was introduced to the chamber through the carrier gas inlet pipe 19 till the pressure became 760 Torr and the gas exhaust duct 21 was opened to continue the gas flow. Then, a gas mixture of vaporized tetraethoxy silane (TEOS) and oxygen was fed through the gas inlet pipe 18 until the gas content ratio became to "TEOS:oxygen:argon=1:7:92". The gases were kept feeding at the rate shown in Table 3. The pulse modulated electric field which had the waveform, the peak value, the frequency, the pulse duration, the onset/offset time shown in Table 3, was imposed for 3 minutes to generate a plasma to deposit a film on the surface of the PET substrate.

The generated plasma showed uniformly dispersed glow state which has a characteristic of the glow-discharge. The surface of the deposited film was analyzed by X-ray photoelectron spectroscopy (XPS), which showed a peak attributed to $SiO_2$ and an element ratio of oxygen to silicon of: O/Si=1:2.2.

EXAMPLE 14

Another sample was obtained under the same conditions as in Example 13 except that the substrate was soda glass (sodium silicate salt) having a refractive index of 1.52. The deposited film on the substrate was analyzed by an Elipsometer DVA-36VM, manufactured by Mizojiri Optical Works, Ltd., which gave a refractive index reading of 1.44. The refractive index of quartz is 1.45.

EXAMPLE 15

Another treated sample was obtained in the same conditions as in Example 14 except that 20 wt. % tetraisopropoxy titanium (titanium alkoxide, TAOT) solution in 2-isopropyl alcohol was atomized and added to the gas as the metal source. The gas volume ratio in the chamber after the introduction of all gases was "TAOT soln.:oxygen:argon= 1:7:92". The discharge current density was 60 $mA/cm^2$.

The deposited film on the substrate was analyzed by the XPS, which gave a peak reading attributed to $TiO_2$. The element ratio of oxygen to titanium was: O/Ti=2.3.

The refractive index of the clear film deposited on the glass substrate was 2.14 in average of 5 readings. The refractive index of titanium dioxide is 2.15

Judging from the above examples, it is obvious that metal oxide films can be formed on a polymer film or a glass substrate, and the deposited film has indices close to the theoretical value.

Reference 2

In the apparatus of Example 13, a soda glass substrate was exposed to a discharge generated by a sine wave of 15 kHz, 150 W, under a gaseous mixture of TEOS, oxygen and helium having a volume ratio of "$TEOS:O_2:He=1:7:92$". A discharge is generated, but the TEOS was not decomposed but merely condensed on the substrate.

Interferogram of a thin film is observed on the surface but since it was washed off by ethanol, just the oligomer of TEOS must have been deposited. The thin films obtained in Examples 13, 14 and 15 were dense and not washed off by ethanol.

TABLE 2

Plasma treating conditions

| | Waveform | Peak value (kV) | Frequency (kHz) | Duration of pulse in a cycle ($\mu$s) | onset/ offset time ($\mu$s) | Treating gas | Flow rate (sccm) | Solid dielectric | Discharge current density (mA/cm$^2$) | Contact angle (degree) |
|---|---|---|---|---|---|---|---|---|---|---|
| Example 1 | (a) | 9.1 | 3.5 | 160 | 10 | $N_2$ | 200 | PTFE | 9 | 25 |
| Example 2 | (b) | 7.5 | 2.6 | 200 | 10 | $N_2$ | 200 | PTFE | 6 | 29 |
| Example 3 | (c) | 6.4 | 1.0 | 800 | 10 | $N_2$ | 200 | PTFE | 7 | 32 |
| Example 4 | (d) | 7.4 | 1.0 | 800 | 10 | $N_2$ | 200 | PTFE | 7 | 26 |
| Example 5 | (a) | 5.2 | 7.1 | 100 | 10 | 3% $CF_4$/Ar | 1000 | PTFE | 5 | 115 |
| Example 6 | (a) | 6.1 | 2.8 | 120 | 10 | 1% $C_3F_6$/Ar | 1000 | PTFE | 5 | 121 |
| Example 7 | (a) +DC | 5.5 | 2.8 | 120 | 10 | 1% $C_3F_5$/Ar | 1000 | PTFE | 5 | 124 |
| Example 8 | (a) | 8.4 | 2.4 | 140 | 10 | 1% $CH_3OH$/Ar | 1000 | PTFE | 6 | 9 |
| Reference 1 | sine wave of 8.4 kV, 2.4 kHz | | | | | $N_2$ | 200 | PTFE | — | 40~60 |

TABLE 3

Plasma treating conditions

| | Waveform | Peak value (kV) | Frequency (kHz) | Duration of pulse in a cycle ($\mu$s) | onset/ offset time ($\mu$s) | Treating gas | Flow rate (sccm) | Solit dielectric | Discharge current density (mA/cm$^2$) | Contact angle (degree) | Element ratio O/Si | Refractive index |
|---|---|---|---|---|---|---|---|---|---|---|---|---|
| Example 9 | (a) | 5.5 | 8.2 | 100 | 300 | 3% $C_3F_5$/$N_2$ | 1000 | Quartz glass | 10 | 123 | — | — |
| Example 10 | (a) | 3.8 | 11.4 | 100 | 300 | 1% $CF_4$ + 1% $O_2$/Ar | 1000 | Quartz glass | 8 | 18 | — | — |
| Example 11 | (a) | 2.8 | 15.1 | 10 | 6 | 2% $C_4F_6$/Ar | 1000 | $TiO_2$—$Al_2O_3$ | 12 | 125 | — | — |
| Example 12 | (a) | 4.4 | 10.5 | 10 | 6 | $N_2$ | 1000 | $TiO_2$—$Al_2O_3$ | 25 | 17 | — | — |
| Example 13 | (a) | 16 | 8.0 | 100 | 300 | 1% TEOS + 7% $O_2$/Ar | 2000 | $Y_2O_3$—ZrO | 60 | — | 2.2 | — |
| Example 14 | (a) | 16 | 8.0 | 100 | 300 | 1% TEOS + 7% $O_2$/Ar | 2000 | $Y_2O_3$—ZrO | 60 | — | 2.13 | 1.44 |
| Example 15 | (a) | 16 | 8.0 | 100 | 300 | 1% TEOS + 7% $O_2$/Ar | 2000 | $Y_2O_3$—ZrO | 60 | — | 2.3 | 2.14 |
| Reference 2 | Sine wave of 15 kHz, 150 W | | | | | 1% TESO + 7% $O_2$/He | 2000 | $Y_2O_3$—ZrO | 0.8 | Film washed off | | |

EXAMPLE 16

In stead of the dielectric 16 in the apparatus of Example 13, a carbon steel disk of SS41 having a dimension of φ140 mm×10 mm was placed on the lower electrode 15 opposing the upper electrode 14 in a distance of 14 mm. The opposing surface of the carbon steel disk was coated in a thickness of 500 micron with an oxide film consisting of 13% of titanium oxide and 87% of aluminum oxide. The oxide film was formed by thermal sprayed coating and had a dielectric constant of 14. A glass fiber reinforced polyurethane foam (GRPU foam, Neolumber FFU) made by Sekisui Chemical Co., Ltd. having a dimension of 100 mm×100 mm×2 mm was placed on the above mentioned dielectric covered steel disk.

The inside air was drawn to 1 Torr by an oil rotary pump and the nitrogen gas was introduced to the chamber through the carrier gas inlet pipe 19 till the pressure became 760 Torr. The pulse modulated electric field was synthesized from a pulse waveform field of 8 kHz having an onset time of 0.5 microseconds and a peak value of 8 kV by being modulated by a pulse field having a frequency of 135 Hz and a duty ratio of 43%. This electric field was imposed for 5 seconds to generate plasma to treat the surface of the GRPU foam substrate.

Figure 5:
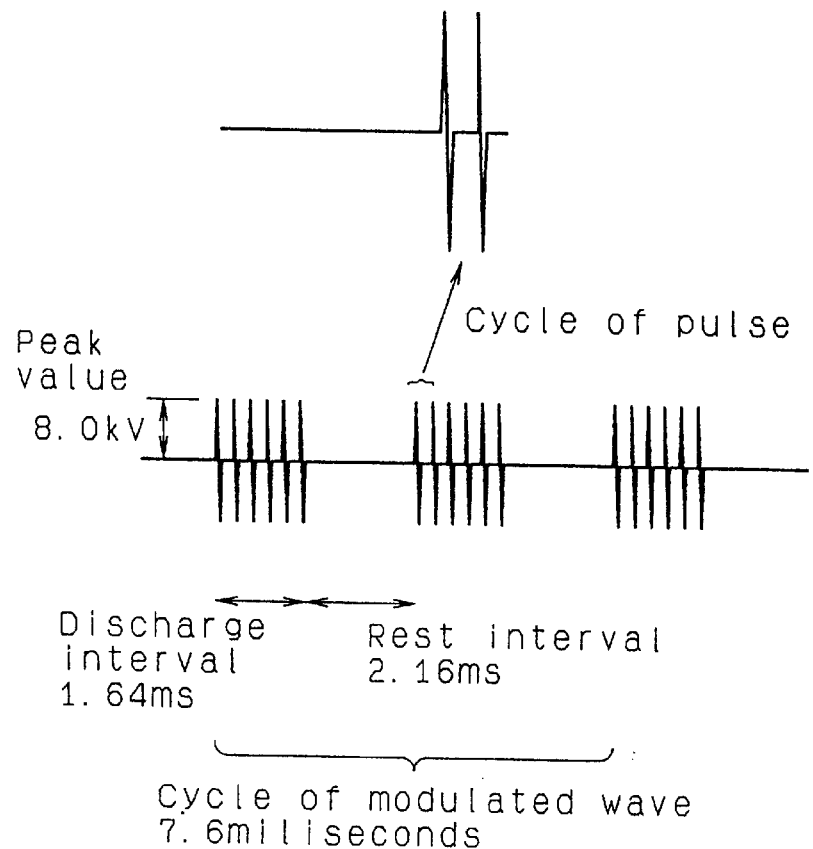
FIG. 5 is a graph showing the waveform of the pulse modulated electric field applied in Example 16.

The generated plasma showed uniformly dispersed glow state. The waveform of the modulated electric field is shown in FIG. 5.

The obtained sample was evaluated by measuring the contact angle.

Further, the treated surface was coated with urethane paint for railroad tie and dried well. A peel test was conducted on the painted surface according to the JIS K5400-Subclause 6.15 "Knife Cutting Method." Table 4 shows the three measurements in the grade points and the average of the three, for each sample. A control sample was evaluated in the contact angle and the paint peel, a result of which is shown in Table 4 as well.

EXAMPLE 17

Figure 6:
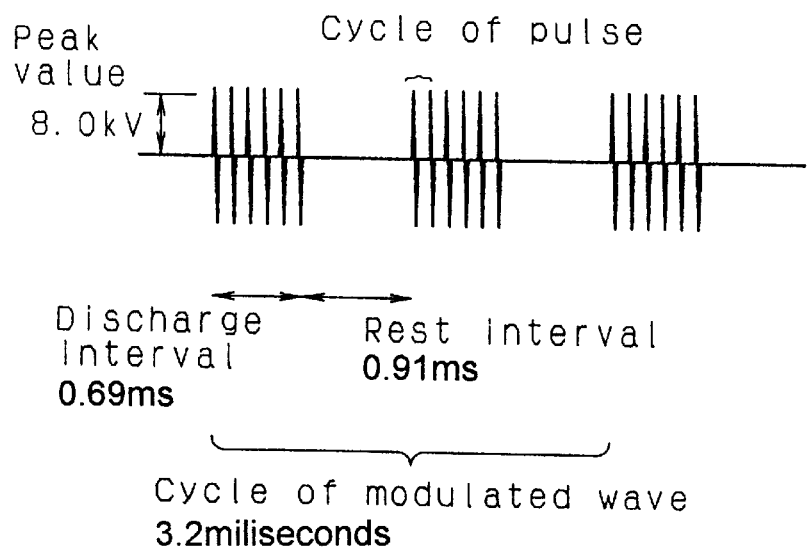
FIG. 6 is a graph showing the waveform of the pulse modulated electric field applied in Example 17.

A treated sample was obtained in the same condition as Example 16 except that the imposed field was modulated by a pulse field of 310 Hz. The waveform of the modulated field is shown in FIG. 6.

The obtained specimen was evaluated by the contact angle and the paint peel, a result of which is shown in Table 4.

TABLE 4

| | Plasma treating conditions | | | | | | | | Peel test by "Knife Cutting Method" | | |
|---|---|---|---|---|---|---|---|---|---|---|---|
| | Basic pulse | | | | Modulating pulse | | | Discharge | JIS K5400 subclause 6.15 grade) | | |
| | | Peak | | Duration | onset/ offset | | Duty | | current | Contact | |
| | Wave-form | value (kV) | Frequency (kHz) | of pulse in a cylce (μs) | time (μs) | Frequency (Hz) | ratio (%) | Solid dielectric | density (mA/cm²) | angle (degree) | Three measurements | Average |
| Example 16 | (a) | 8 | 8 | 100 | 0.5 | 135 | 43 | TiO₂—Al₂O₃ | 30 | 28.1 | 8.10.8 | 8.66 |
| Example 17 | (a) | 8 | 8 | 100 | 0.5 | 310 | 43 | TiO₂—Al₂O₃ | 30 | 35.1 | 7.9.8 | 8.00 |
| Control | — | — | — | — | — | — | — | — | — | 98.2 | 0.0.0 | 0 |

Control: Glass fiber reinforced polyurethane foam.

EXAMPLE 18

In the apparatus of Example 16, a substrate of radiation cross-linked polyethylene foam, SOFTLON made by Sekisui Chemical Co., Ltd. having a dimension of 150 mm×300 mm×2 mm was placed and treated in the same conditions as Example 16 except that the peak value of the imposed pulse field was 9.5 kV.

The contact angle of the treated specimen was measured immediately after the treatment, a result of which is shown in Table 5. The contact angle of a control sample was also measured and shown in the same table.

EXAMPLE 19

A treated sample was obtained in the same conditions as Example 18 except that the imposed field was modulated by a pulse field of 450 Hz.

The obtained specimen was evaluated by measuring the contact angle, a result of which is shown in Table 5.

the web exit 24 were closed. The PET web was continuously treated by causing the web to travel at a speed of 15 m/min and imposing a pulse modulated electric field which had a pulse waveform (1) of FIG. 2A-1, a peak value of 11.6 kV, a frequency of 6.5 kHz and a pulse duration of 100 microseconds. The evaluation of the treated web is shown in Table 6.

Reference 3

A treated sample was obtained in the same conditions as Example 20, except that the treating gas was a 3% mixture of carbon tetrafluoride in helium and the discharge was generated by imposing a sine wave AC voltage having a peak value of 15.0 kV and a frequency of 15 kHz.

EXAMPLE 21

A treatment was conducted in the apparatus of Example 20 by using a carbon steel plate 16 coated with the titanium oxide/aluminum oxide film of Example 11 in stead of Pyrex glass and feeding the nitrogen gas through the gas inlet pipe

TABLE 5

| | Plasma treating conditions | | | | | | | | | |
|---|---|---|---|---|---|---|---|---|---|---|
| | Basic pulse | | | | Modulating pulse | | | Discharge | Contact |
| | | Peak value | Frequency | Duration of pulse in a | onset/ offset time | Frequency | Duty ratio | Solid | current density | angle |
| | Wave-form | (kV) | (kHz) | cycle (μs) | (μs) | (Hz) | (%) | dielectric | (mA/cm²) | (degree) |
| Example 18 | (a) | 9.5 | 8 | 100 | 0.5 | 135 | 43 | TiO₂—Al₂O₃ | 30 | 45.7 |
| Example 19 | (a) | 9.5 | 8 | 100 | 0.5 | 450 | 43 | TiO₂—Al₂O₃ | 30 | 51.2 |
| Control | — | — | — | — | — | — | — | — | — | 101.9 |

EXAMPLE 20

Figure 10:
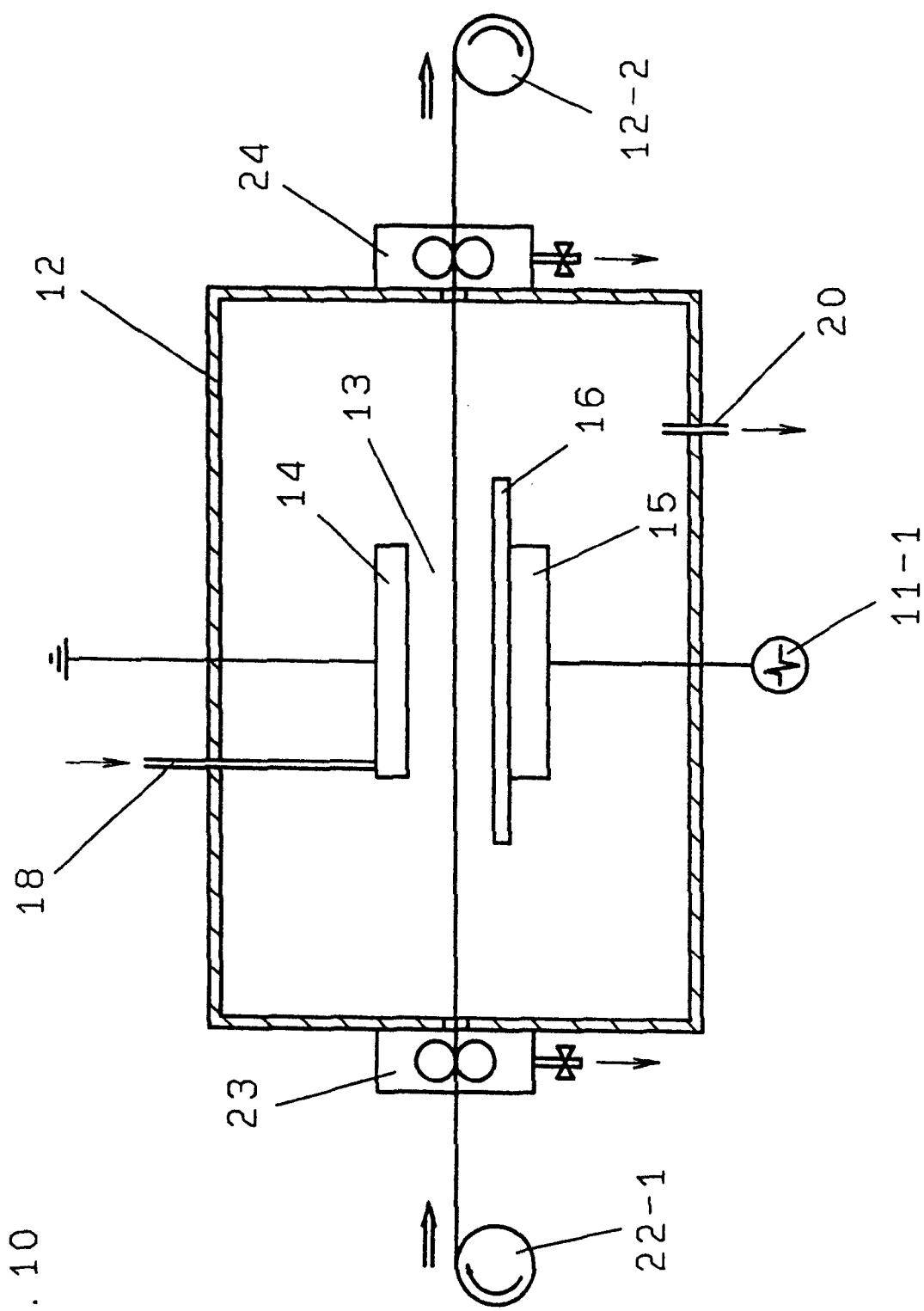
FIG. 10 is a schematic sectional view showing another example of the plasma treatment apparatus used in the present invention.

In the chamber 12 of FIG. 10, an upper electrode 14 made of stainless steel (SUS304) having a size of 150 mm×300 mm and a lower electrode 15 made of stainless steel (SUS304) having a size of 150 mm×300 mm were installed with a 6 mm gap between them. A dielectric 16 of Pyrex glass having a dimension of 200 mm×400 mm×3 mm was placed on the lower electrode 15 to cover its whole surface. Over this dielectric, a PET web having a width of 300 mm and a thickness of 50 micron, was placed as shown in FIG. 10.

A mixture of gas formed of 3% carbon tetrafluoride in argon was fed at a rate of 15 standard liter per minute (slm) through the gas inlet duct 18 while the web entrance 23 and 18 at a flow rate of 30 slm. The same PET web was continuously treated by causing the web to travel at a speed of 30 m/min and imposing a pulse modulated electric field which has a pulse waveform (1) of FIG. 2A-1, a peak value of 10.0 kV, a frequency of 12 kHz, a pulse duration of 10 microseconds and a onset/offset time of 100 nanoseconds. The evaluation of the treated web is shown in Table 6.

Reference 4

A treated specimen was obtained in the same conditions as Example 21 except that the gas atmosphere was a 1% mixture of nitrogen in helium and the discharge was generated by imposing a since wave AC voltage having a peak value of 15.0 kV and a frequency of 15 kHz.

As mentioned before, the contact angles of the specimens of Example 20 and Reference 3 were measured. The surface fluorine concentration (F value) of these samples were analyzed by the XPS. The contact angle measurement and the surface nitrogen concentration (N value) analysis were conducted on the sample of Example 21 and Reference 4, as well. The result is shown in Table 6. All the readings of the contact angle, F value and N value indicate a high level treatment of the pulse modulated field.

The result ascertains that a high density plasma takes place by the pulse modulated field and the surface treatment method of this invention is adequate for a high speed continuous treatment.

TABLE 6

|  | Contact angle (degree) | Surface F value (%) | Surface N value (%) |
|---|---|---|---|
| Example 20 | 95 | 31.5 | — |
| Example 21 | 24 | — | 9.87 |
| Reference 3 | 65 | 9.2 | — |
| Reference 4 | 32 | — | 2.87 |

EXAMPLE 22

Figure 2B:
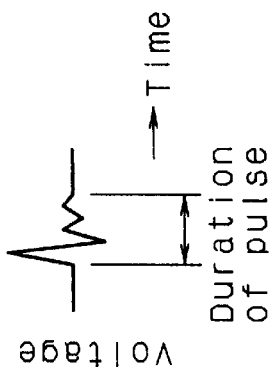
FIG. 2B shows an example of a waveform.
Figures 2, 2A:
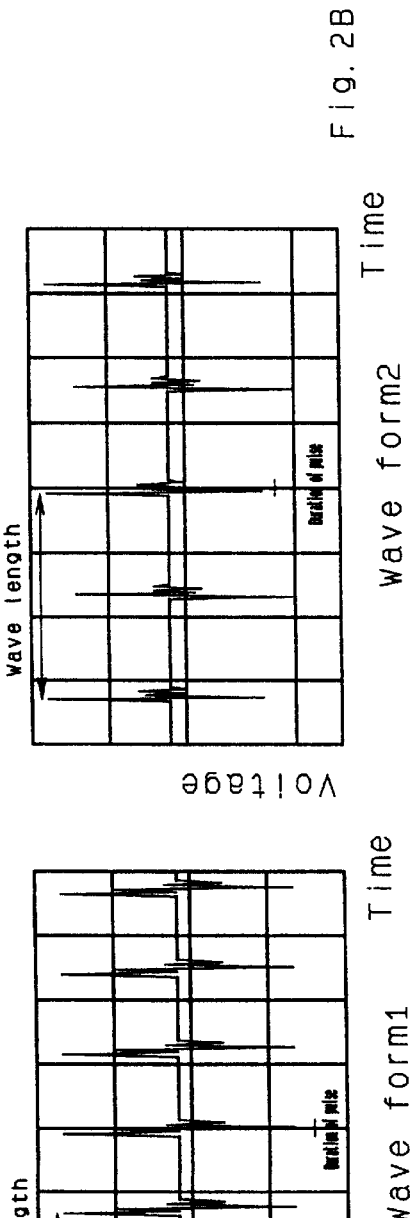

A treated sample was obtained in the same condition of Example 1 except that the solid dielectric 16 was a sintered titanium oxide of rutile crystalline structure having a thickness of 2 mm, a diameter of 120 mm and a dielectric constant of about 70, and that the plasma-discharge was generated for 5 seconds by imposing a pulse modulated electric field which has the waveform (1) of FIG. 2A-1, a peak value, a frequency and a pulse duration as specified in Table 7. The generated plasma showed a uniformly dispersed glow state which has a characteristic of the glow-discharge. The evaluation result is shown in Table 7.

EXAMPLE 23

A treated sample was obtained in the same condition of Example 1 except that the dielectric 16 was a coated carbon steel plate of SS41 having a dimension of 140 mm×140 mm×10 mm and being coated with an oxide film consisting of 13% titanium oxide and 87% aluminum oxide, and that a plasma-discharge was generated for 15 seconds by imposing a pulse modulated electric field having a waveform, a peak value, a frequency and a pulse duration as specified in Table 7. The oxide film of the dielectric 16 was deposited by the thermal sprayed coating on an upper face in 500 micron thickness and had a dielectric constant of 14.

The generated plasma showed a uniformly dispersed glow state which has a characteristic of the glow-discharge. The evaluation result is shown in Table 7.

EXAMPLE 24

A treated sample was obtained in the same conditions of Example 1 except that the dielectric 16 was a coated carbon steel plate of SS41 having a dimension of 140 mm×140 mm×10 and being coated with an oxide film consisting of 8 wt. % yttrium oxide and 87% of zirconium oxide, and that a 3% carbon tetrafluoride gas was introduced to the chamber through the gas inlet pipe 18 at a flow rate of 30 standard cubic centimeter (sccm) and an argon gas was fed through the carrier gas inlet pipe 19 at a flow rate of 2970 sccm. The oxide film of the dielectric 16 was deposited by the thermal sprayed coating on an upper face in 500 micron thickness and had a dielectric constant of 16. The discharge-plasma was generated for 15 seconds by imposing a pulse modulated electric field having a waveform, a peak value, a frequency and a pulse duration specified in Table 7.

Figure 7:
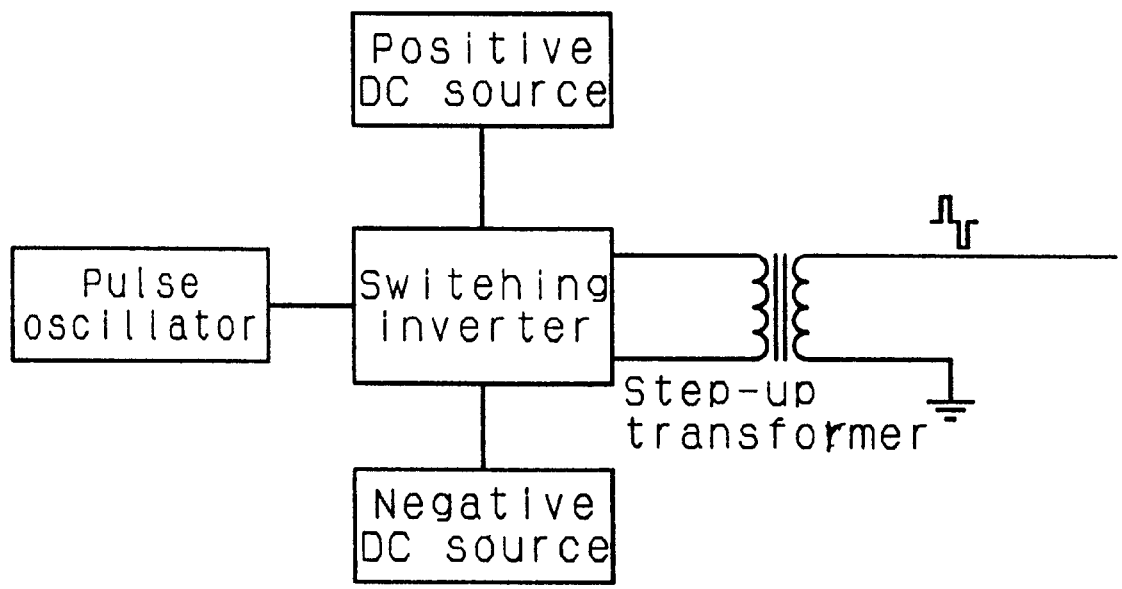
FIG. 7 is a block schematic diagram showing an example of the pulse power unit.

The generated plasma showed a uniformly dispersed glow state which is characteristic of the glow-discharge. The evaluation result is shown in FIG. 7

Reference 5

A treated specimen was obtained in the same condition as Example 22 except that the discharge was generated by imposing a sine wave AC voltage having a peak value of 9.0 kV and a frequency of 15.0 kHz in stead of the pulse modulated electric field.

Many streamers were observed and an ununiformly distributed discharge was confirmed.

Evaluation by Contact Angle

Static contact angles were measured by dropping 2 microliter water on the samples of Example 22 to 24 and Reference 5. The angles were measured by the contact angle meter CA-X150 manufactured by Kyowa Interface Science, Ltd. The results are shown in Table 7.

The specimens of Example 22 to 24 treated under the nitrogen gas atmosphere constantly exhibited a low or high contact angle in all the surface areas showing a good hydrophilic surface or a good water repellent surface, respectively. The specimen of Reference 4 for which an ununiformly distributed discharge was observed exhibited varying angles of 40 to 60 degrees indicating uneven treatments.

TABLE 7

| | Plasma treating conditions | | | | | | | | |
|---|---|---|---|---|---|---|---|---|---|
| | Waveform | Peak value (kV) | Frequency (kHz) | Duration of pulse in a cycle (µs) | onset/ offset time (µs) | Treating gas | Flow rater (sccm) | Solit dielectric | Discharge current density (mA/cm$^2$) | Contact angle (degree) |
| Example 22 | (a) | 6.3 | 3.5 | 160 | 10 | N$_2$ | 200 | TiO$_2$, sintered | 30 | 23 |
| Example 23 | (a) | 5.5 | 2.6 | 200 | 10 | N$_2$ | 200 | TiO$_2$—Al$_2$O$_3$ | 25 | 22 |
| Example 24 | (a) | 3.4 | 1.0 | 800 | 10 | 3% CF$_4$/Ar | 1000 | Y$_2$O$_3$—ZrO | 20 | 113 |
| Reference 5 | Sine wave | 9.0 | 15.0 | — | — | N$_2$ | 200 | TiO$_2$, sintered | — | 40~60 |

EXAMPLE 25

Figure 11:
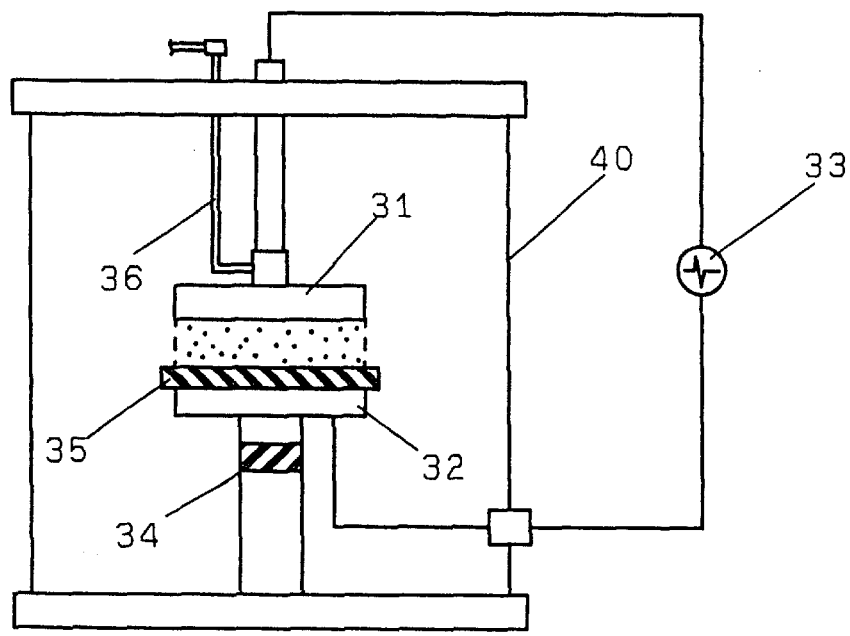
FIG. 11 is a schematic sectional view showing the structure of the plasma generating apparatus used in certain Examples of the present invention.

A schematic diagram of the apparatus used in Example 25 is shown in FIG. 11. An upper electrode 31 and a lower electrode 32 were mounted to oppose to each other in a glass chamber 40 of 8 liter volume. A pulse power unit 33 was provided to apply pulse modulated electric field between the electrodes 31 and 32. The lower electrode 32 was mounted to the chamber 40 in an electrically insulated manner by inserting an insulator 34 between the electrode and the chamber. A solid dielectric 35 is disposed tightly on the to upper surface of the lower electrode 32 opposing to the upper electrode 31. An oil rotary pump (not shown in FIG. 11) was connected to the chamber 40 to evacuate the inside air.

The upper electrode had a porous structure with many tiny holes, so that an atmospheric gas fed through a connected gas inlet pipe 36 could diffuse into the chamber.

The upper electrode 31 was made of a stainless steel disk of 80 mm diameter and had many holes of 1 mm diameter in every 5 mm interval.

The lower electrode 32 was made of a stainless steel disk of 80 mm diameter and mounted in parallel with and 4 mm apart from the upper electrode 32. The dielectric 35 covering the top surface of the lower electrode was a glass plate having a dimension of 140 mm×140 mm×2 mm and a dielectric constant of 5.

Figures 2, 2A, 3, 4:
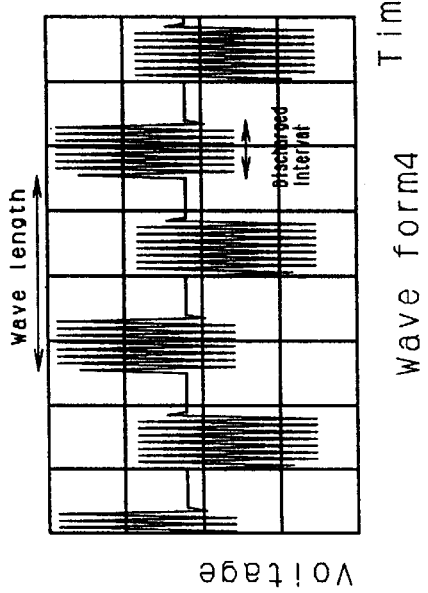
Figures 1, 2A:
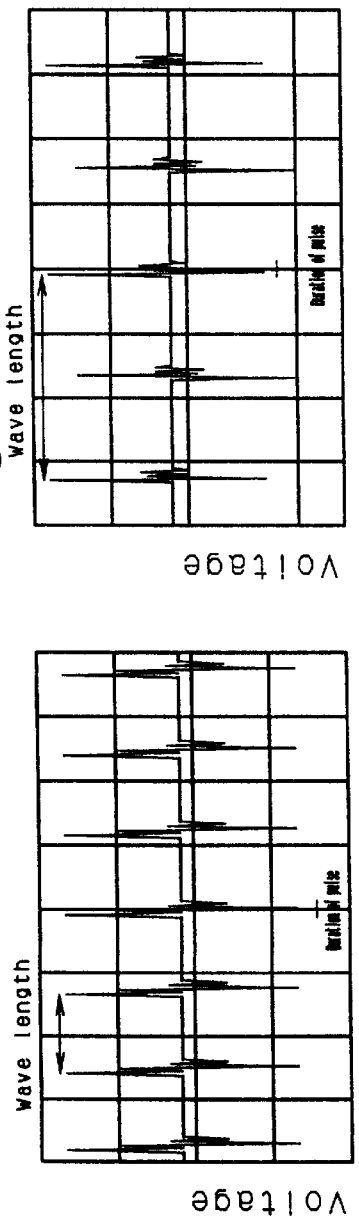
Figures 2, 2A, 3:
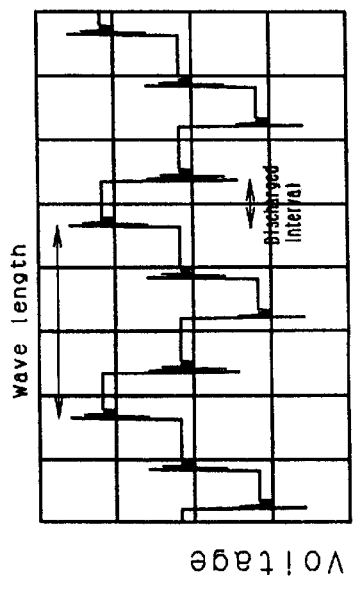
Figure 3:
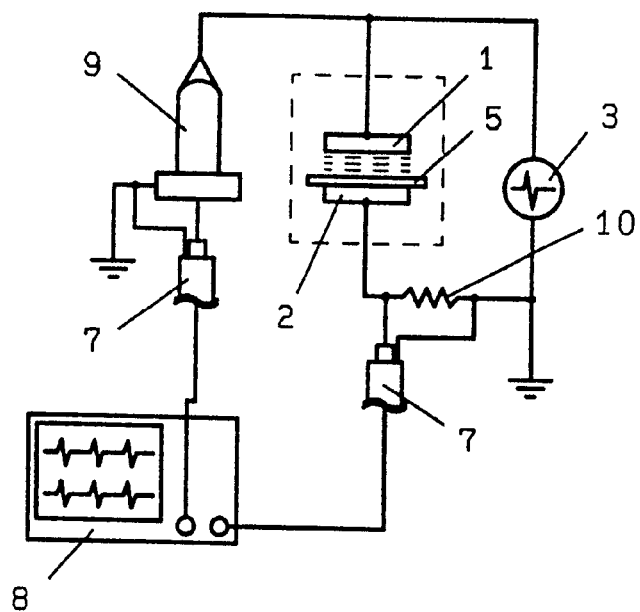
Figure 4:
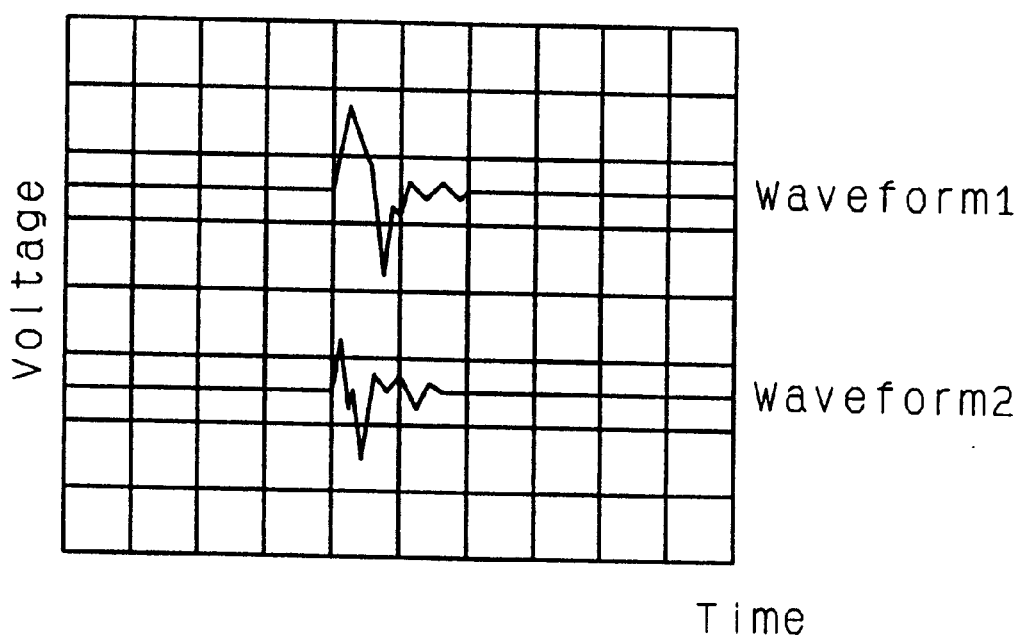

The electrode area of this assembly was 50 cm$^2$ and the discharge gap was 2 mm. The discharge voltage and the discharge current were measured by the same method and the circuit of FIG. 3, though not shown in FIG. 11.

In the above apparatus, air in the chamber 40 was drawn to less than 0.1 Torr, and an argon gas was introduced to the chamber at a flow rate of 1000 sccm through the gas inlet pipe 36 till the pressure became 760 Torr. An impulse voltage having a frequency of 4 kHz, an onset/offset time of 5 microseconds and a peak-peak voltage of 5 kV was applied, so that a homogeneous glow appeared between the electrodes 31 and 32. The glow had the main bright line at 763 nm.

The applied 5 kV voltage made a 25 kV/cm field intensity and generated a discharge current of 400 mA, i.e. a current density of 8 mA/cm$^2$.

EXAMPLE 26

A 50 mm square PET film of Lumirror T-50 made by Toray Ind. having a contact angle of 60 degrees was placed on the solid dielectric 35 of the apparatus of FIG. 11. A carbon tetrafluoride gas at a flow rate of 20 sccm and an argon gas at a flow rate of 980 sccm was fed to the chamber 40 through the gas inlet pipe 36. Other conditions were kept same as Example 25. Then, a discharge-plasma was generated for 15 seconds by applying an impulse voltage which had the same waveform as Example 25 except that the peak-peak voltage was 10 kV. The result of evaluation of the PET film is shown in Table 8.

EXAMPLE 27

A treated sample was obtained under the same conditions as Example 25 in the apparatus of FIG. 11 except that the dielectric 35 was a polytetrafluoroethylene sheet having a dimension of 140 mm×140 mm×2 mm and a dielectric constant of 2.5. The evaluation result of the PET film is shown in Table 8.

EXAMPLE 28

A treated sample was obtained in the apparatus of FIG. 11 in the same conditions of Example 26 except that the dielectric 35 was a coated carbon steel plate of SS41 having a dimension of 140 mm×140 mm×10 mm and being coated with an oxide film consisting of 13% titanium oxide and 87% aluminum oxide, and that a discharge-plasma was generated by applying an impulse voltage which had the same waveform as Example 26 except the peak-peak voltage which was 5 kV. The oxide film of the dielectric 16 was deposited by the thermal spray coating on an upper face in 500 micron thickness and had a dielectric constant of 14.

In this example, the distance between the electrodes was adjusted to 12 mm so that the discharge gap was 2 mm. The result of evaluation of the PET film is shown in Table 8.

EXAMPLE 29

A treated sample was obtained in the apparatus of FIG. 11 in the same conditions of Example 28 except that the carbon steel plate 35 had a coated surface of 500 micron thickness consisting of 8 wt. % yttrium oxide and 87% zirconium oxide which had a dielectric constant of 16. The result of evaluation of the PET film is shown in Table 8.

The above Examples 26 to 29 were water repellent treatment for PET film and the results are summarized in Table 8. The curve of FIG. 12 derived from Table 8 shows the dependency of the treated effect on the current density. These results clearly indicate that any of the dielectrics used here gave the water repellent effect and the discharge current density can be controlled by the value of their dielectric constants.

Figure 12:
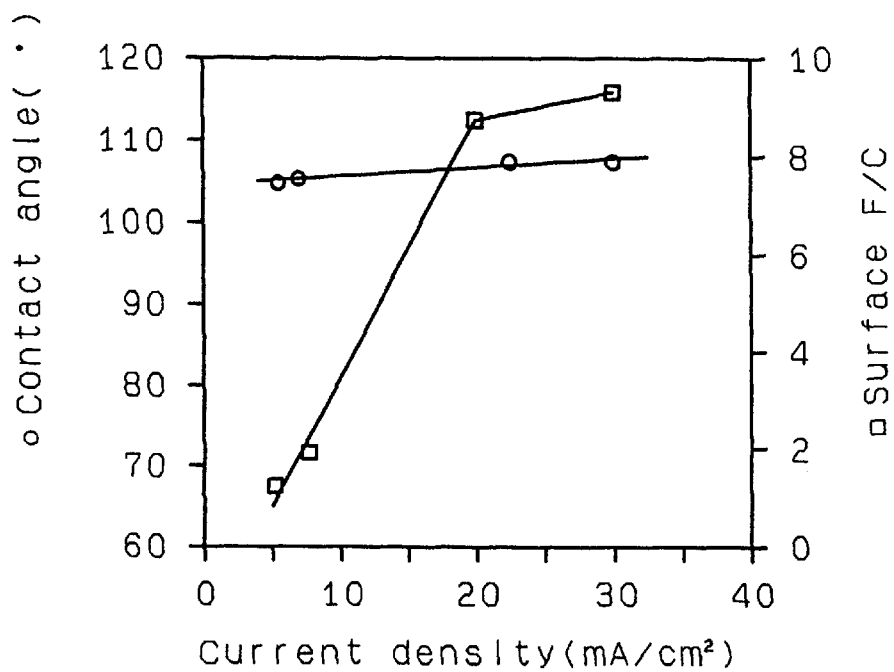
FIG. 12 is a graph showing a dependency of water repellent property on the discharge current density in PET film treatments of Examples 26, 27, 28 and 29.

"Surface F/C" of Table 8 and FIG. 12 is defined as the ratio of fluorine and carbon masses in the surface of the substrate (PET) analyzed by the XPS. It is obvious that a higher current density produces a more highly fluorinated surface.

TABLE 8

| | Plasma treating conditions | | | | | Results | | | |
|---|---|---|---|---|---|---|---|---|---|
| | Wave-form | Frequency (kHz) | onset/offset time (μs) | Solid dielectric Material | Dielectric constant | Field intensity (kV/cm) | Discharge currenly density (mA/cm$^2$) | Contact angle (degree) | Surface F/C |
| Example 25 | (a) | 4 | 5 | Glass | 5 | 25 | 8 | — | — |
| Example 26 | (a) | 4 | 5 | Glass | 5 | 50 | 8 | 105 | 2.2 |
| Example 27 | (a) | 4 | 5 | PTFE | 2.5 | 50 | 6 | 104 | 1.5 |
| Example 28 | (a) | 4 | 5 | Ti$_2$O$_3$—Al$_2$O$_3$ | 14 | 25 | 20 | 107 | 8.8 |
| Example 29 | (a) | 4 | 5 | Y$_2$O$_3$—ZrO$_3$ | 16 | 25 | 30 | 108 | 9.2 |
| Example 30 | (a) | 4 | 5 | Glass | 5 | 11 | 1 | 100 | — |

EXAMPLE 30

A treated sample was obtained in the apparatus of FIG. 11 in the same conditions of Example 26 except that the applied voltage had a peak-peak value of 2.2 kV. In this trial, the minimum voltage was applied enough to create a uniformly distributed discharge using the glass dielectric sheet. The obtained current density was 1 mA/cm$^2$. The PET film exhibited a contact angle of 100 degrees and was uniformly modified throughout the whole sheet.

EXAMPLE 31

A treated sample was obtained in the apparatus of FIG. 11 in the same conditions of Example 26 except that the nitrogen gas was fed to the chamber 40 through the gas inlet pipe 36 at a flow rate of 1000 sccm and that the applied voltage had a peak-peak value of 30 kV. The evaluation of hydrophilicity is shown in Table 8.

EXAMPLE 32

A treated sample was obtained in the apparatus of FIG. 11 in the same conditions of Example 27 except that the nitrogen gas was fed to the chamber 40 through the gas inlet pipe 36 at a flow rate of 1000 sccm and that the applied voltage had a peak-peak value of 30 kV. The evaluation of hydrophilicity is given in Table 8.

EXAMPLE 33

A treated sample was obtained in the apparatus of FIG. 11. in the same conditions of Example 28 except that the nitrogen gas was fed to the chamber 40 through the gas inlet pipe 36 at a flow rate of 1000 sccm and that the applied voltage had a peak-peak value of 14 kV. The evaluation of hydrophilicity is given in Table 8.

EXAMPLE 34

A treated sample was obtained in the apparatus of FIG. 11 in the same conditions of Example 29 except that the nitrogen gas was fed to the chamber 40 through the gas inlet pipe 36 at a flow rate of 1000 sccm and that the applied voltage had a peak-peak value of 14 kV. The evaluation of hydrophilicity is shown in Table 8.

The above Examples 31 to 34 were hydrophilic treatments for PET films and the results are summarized in Table 9. The curve of FIG. 13 derived from Table 9 shows the dependency of the hydrophilicity on the discharge current density. These results clearly indicate that any of the dielectrics used here functioned well to provide hydrophilicity and the discharge current density can be controlled by the value of their dielectric constants, as in the case of water repellent treatment.

Figure 13:
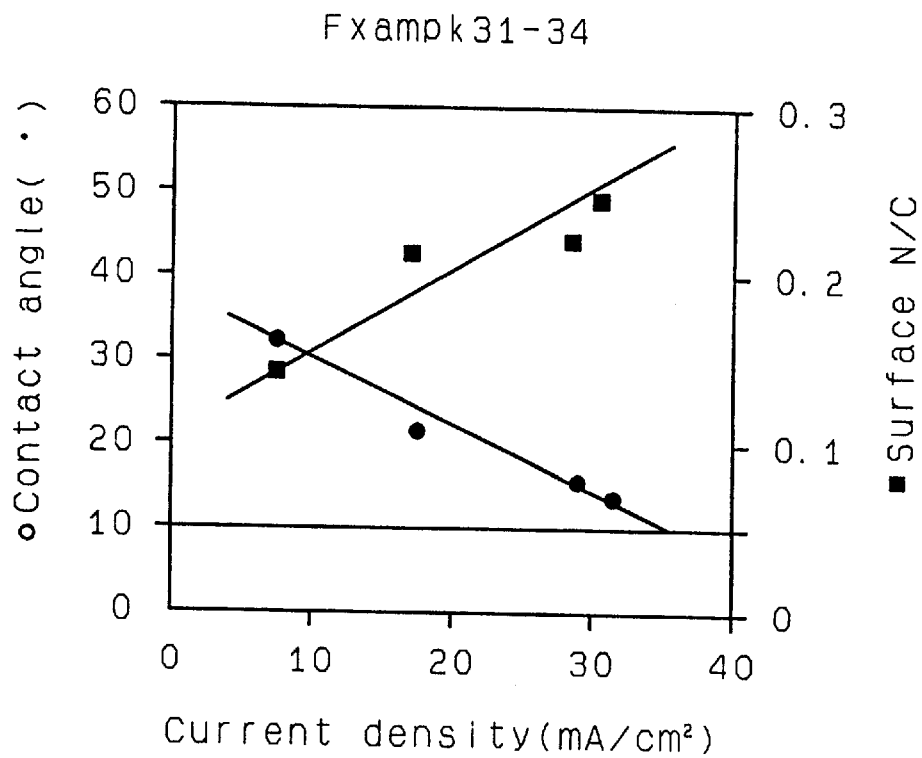
FIG. 13 is a graph showing a dependency of hydrophilicity on the discharge current density in PET film treatments of Examples 31, 32, 33 and 34.

"Surface N/C" of Table 9 and FIG. 13 is defined as the ratio of nitrogen and carbon masses in the surface of the substrate (PET) analyzed by the XPS. It is obvious that a higher current density produces a higher amount of fixed nitrogen to the surface, i.e. more highly aminized surface.

EXAMPLE 35

A treated sample was obtained in the same conditions of Example 34 except that the applied voltage had a peak-peak value of 30 kV. The discharge current density was 100 mA/cm². The initial contact angle was 21 degrees and the Surface N/C was 0.5.

Reference 6

A PET film is exposed to a corona discharge for 15 seconds, generated in a corona treatment apparatus Model HFSS-103 manufactured by Kasuga Electric Co. The voltage applied was 30 kV. The treated hydrophilic sample exhibited an initial contact angle of 35 degrees.

The hydrophilic samples of Example 35 and Reference 6 were treated at 60° C. in a chamber Model ST-110 manufactured by Tabai-Especk Co. to conduct an accelerated durability test of hydrophilicity. The change in contact angle $\theta t$ was calculated from the following equation:

$$\log\theta = \log\frac{\theta t - \theta\infty}{\theta 0 - \theta\infty}$$

wherein $\theta 0$ is the initial contact angle, $\theta t$ is that of t minutes later and $\theta\infty$ is the angle of untreated surface.

Figure 14:
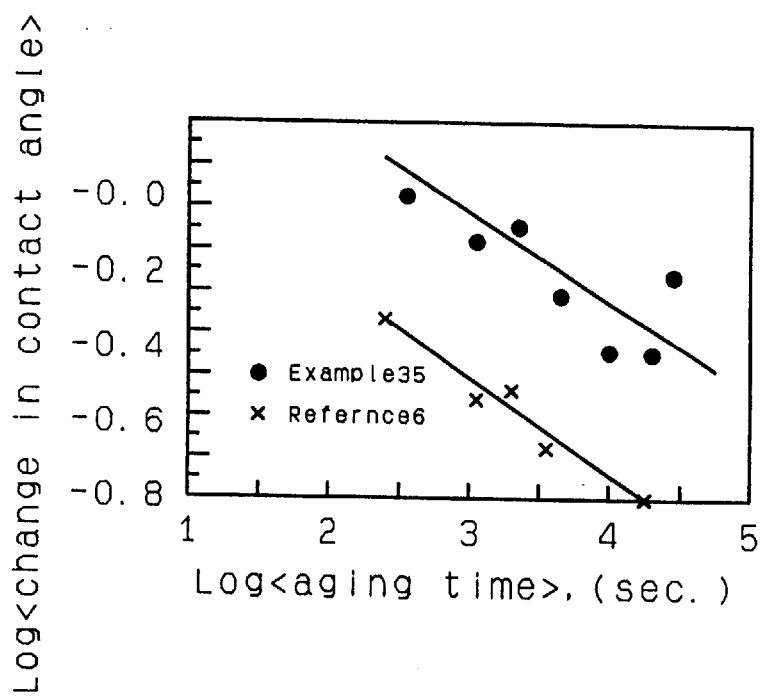
FIG. 14 is a graph showing aging of hydrophilicity of treated films of Example 35 and Reference 6.

The changes of hydrophilicity calculated by the above equation for the mentioned two samples are shown in FIG. 14. It became obvious in FIG. 14 that the hydrophilic treatment of Example 35 of this invention provided about ten times as much durability as the conventional corona discharge treatment.

EXAMPLE 36, 37 and 38

Figure 15:
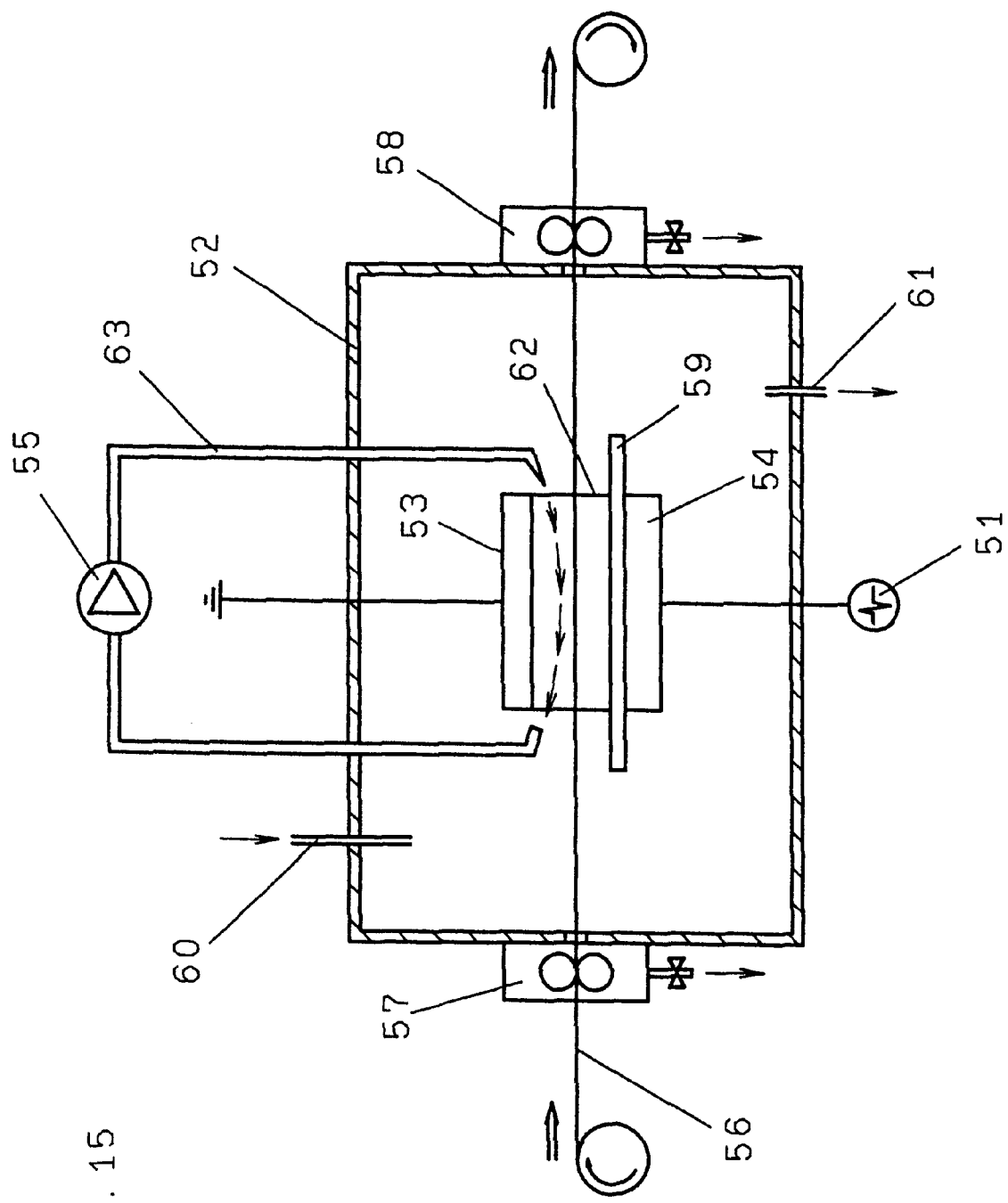
FIG. 15 is a schematic sectional view showing an example of the continuous treatment apparatus for web used in the present invention.
Figure 16:
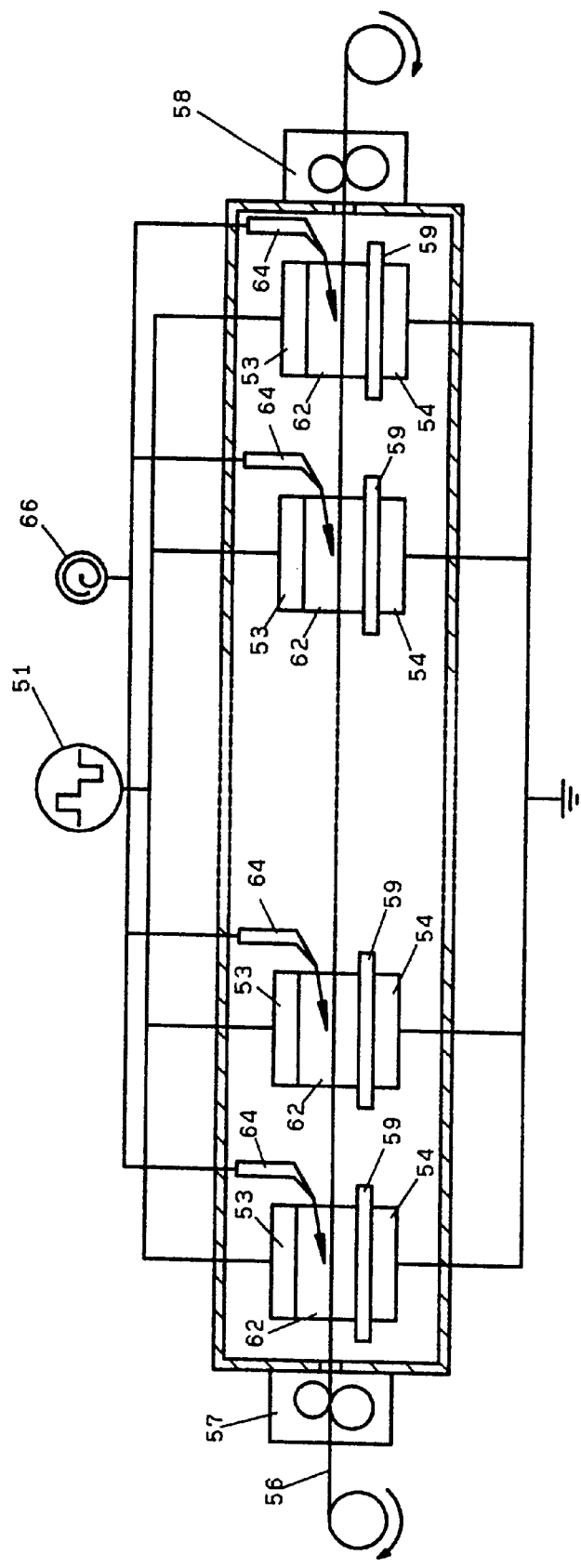
FIG. 16 is a schematic sectional view showing another example of the continuous treatment apparatus for web.
Figure 17:
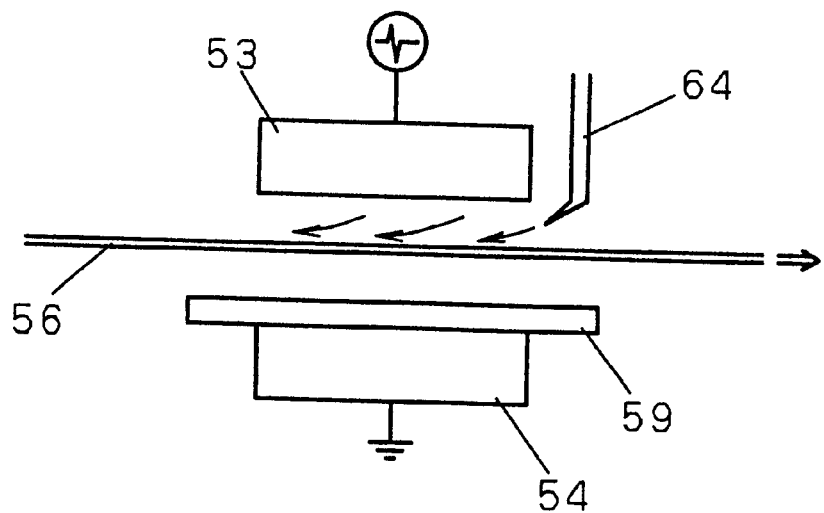
FIG. 17 is a schematic view showing an example of the gas flow generator.
Figure 18:
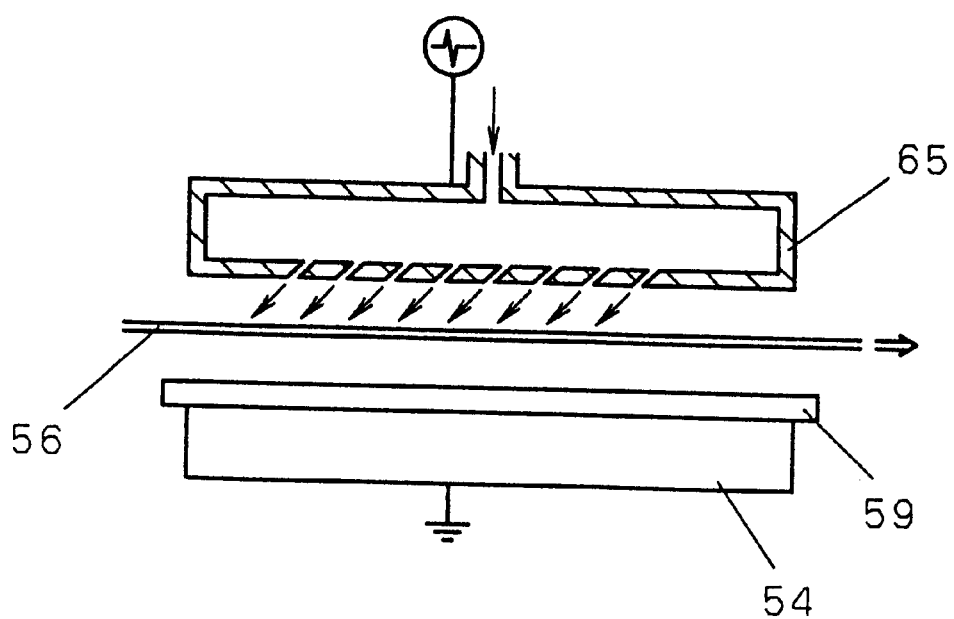
FIG. 18 is a schematic view showing another example of the gas flow generator.
Figure 19:
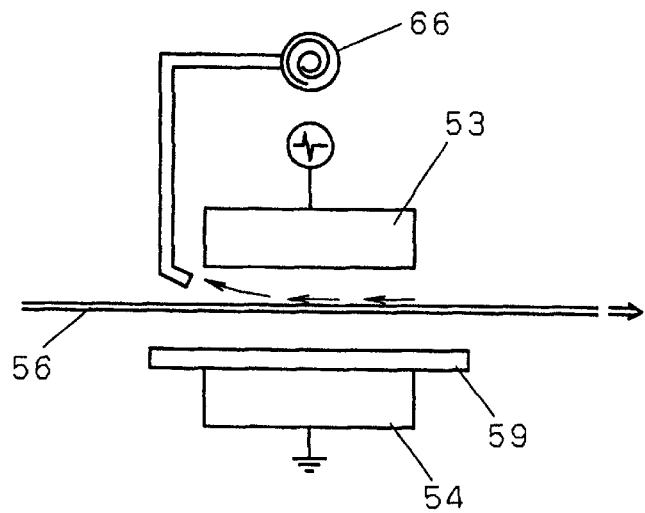
FIG. 19 is a schematic view showing yet another example of the gas flow generator.
Figure 20:
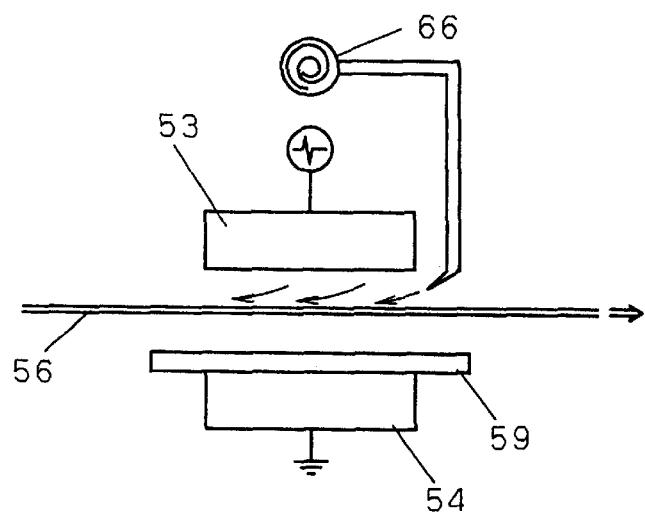
FIG. 20 is a schematic view showing yet another example of the gas flow generator.
Figure 21:
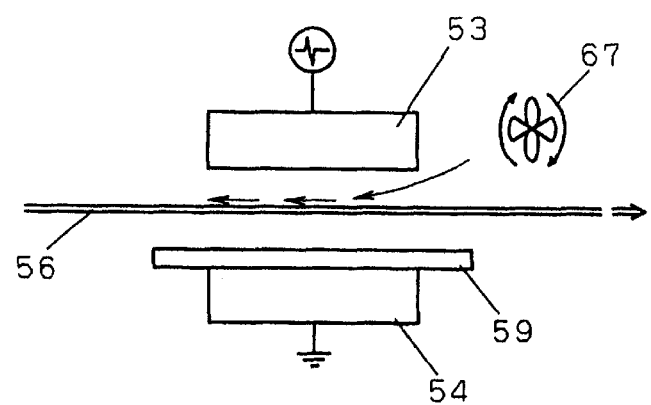
FIG. 21 is a schematic view showing yet another example of the gas flow generator.

In the apparatus of FIG. 15 having a gas flow generator 55 with a built-in turbo-blower and two electrodes, each 350 mm wide and 150 mm long, a PET web of 300 mm width and 50 micron thickness (Lumirror T-50, made by Toray Ind.) having a contact angle of 70 degrees, was treated to provide water repellent surfaces, by the operation mentioned below, under the conditions specified in Table 10. The static contact angles of the treated surfaces were measured.

The measurement was made by dropping 2 microliter water at 10 cm interval on 1 meter samples cut from the treated web. The static contact angle was measured by the contact angle meter CA-X150 manufactured by Kyowa Interface Science, Ltd. The largest and the smallest readings are shown in Table 10.

Operation

A roll of PET web to be treated is placed on the unwinding station and the web is passed through the entrance 57 and the electrode gap which is adjusted to the specified distance

TABLE 9

| | Plasma treating conditions | | | | | Results | | |
|---|---|---|---|---|---|---|---|---|
| | Wave-form | Frequency (kHz) | onset/offset time ($\mu$s) | Solid dielectric Material | Dielectric constant | Field intensity (kV/cm) | Discharge current density (mA/cm²) | Contact angle (degree) | Surface F/C |
| Example 31 | (a) | 4 | 5 | Glass | 5 | 150 | 16 | 32 | 0.21 |
| Example 32 | (a) | 4 | 5 | PTFE | 2.5 | 150 | 8 | 26 | 0.15 |
| Example 33 | (a) | 4 | 5 | TiO$_2$O$_3$—Al$_2$O$_3$ | 14 | 70 | 28 | 22 | 0.22 |
| Example 34 | (a) | 4 | 5 | Y$_2$O$_3$—ZrO$_2$ | 16 | 70 | 30 | 21 | 0.25 |
| Example 35 | (a) | 4 | 5 | Y$_2$O$_3$—ZrO$_2$ | 16 | 150 | 100 | 21 | 0.5 |

(Table 10) where the specified dielectric (Table 10) is placed, and through the exit 58 to the winder in the winding station. After closing the entrance and the exit, air in the treating chamber 52 is replaced by the specified treating gas (Table 10) fed through the gas inlet pipe 61 at the specified flow rate (Table 10) under atmospheric pressure. When the replacement is completed, a desired gas flow is generated in the electrode gap by the gas flow generator 55 and the web is caused to move by the winder at a speed of 30 m/min from the entrance 57 towards the exit 58. A continuous treatment is conducted in a discharge-plasma in the electrode gap by imposing a pulse modulated electric field of waveform (1) of FIG. 2-1 specified in Table 10. The contact angles (max. and min.) measured on the obtained samples are shown in Table 10.

EXAMPLE 39 & 40

A continuous hydrophilic treatment was conducted in the same apparatus and by the same operation as Example 36 but under different conditions specified in Table 10. The contact angles (max. and min.) measured on the obtained samples are shown in Table 10.

Reference 7

A water repellent treating operation was tried in the same apparatus and the same conditions of Example 36 except that the applied voltage had a sine waveform as specified in Table 10. But a high voltage over 10 kV was necessary to initiate a discharge, which happened to be an arc, not a glow. Consequently, the PET web was melted and the treatment failed.

For a reference purpose, a very similar treatment was conducted by using a diluting gas of helium instead of argon. The result and the conditions are shown in Table 10 in the column of Reference 7.

EXAMPLE 41

Figure 22:
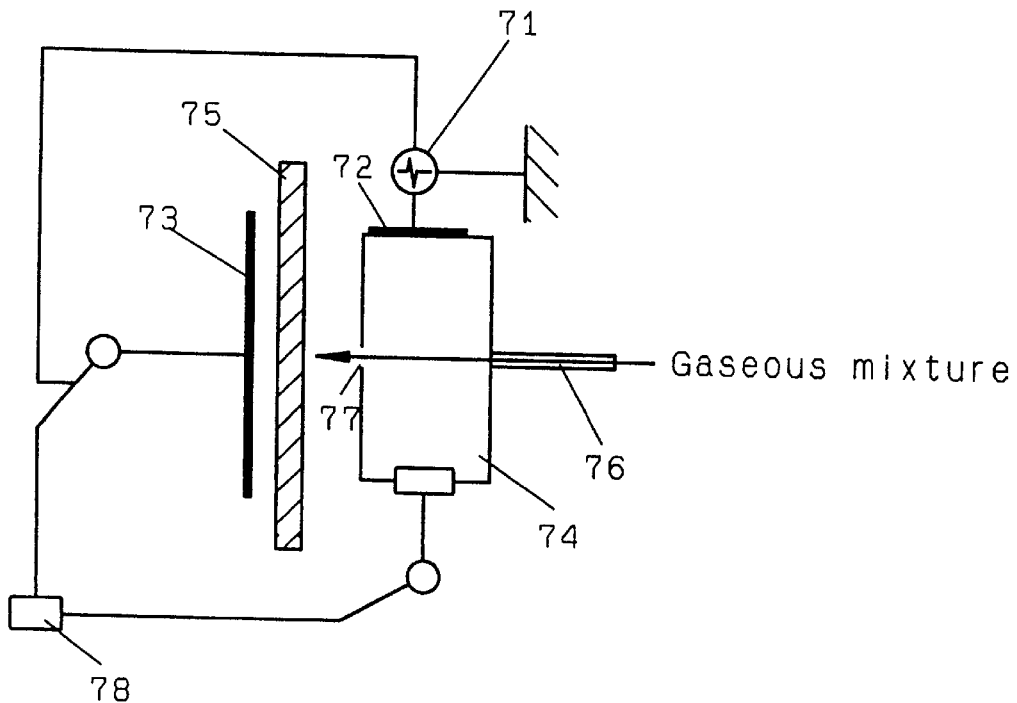
FIG. 22 is a schematic sectional view showing yet another example of the plasma treatment apparatus used in the present invention.
Figure 23:
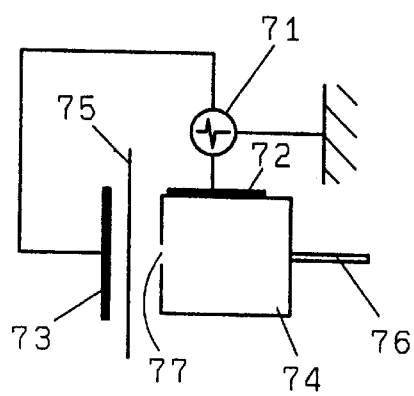
FIG. 23 is a schematic view of a dielectric gas reservoir opposing an electrode in the plasma treatment apparatus.
Figure 24:
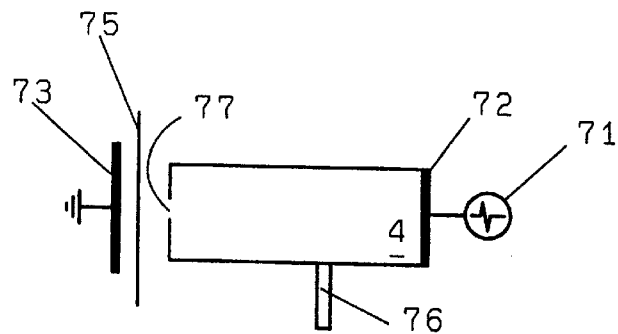
FIG. 24 is another schematic view of a dielectric gas reservoir opposing an electrode in the plasma treatment apparatus.
Figure 25:
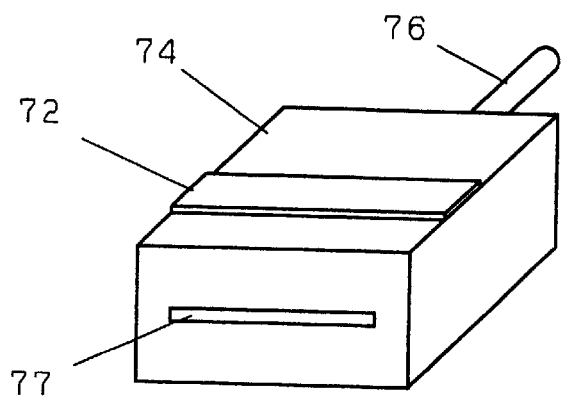
FIG. 25 is a diagram of a gas outlet in the plasma treatment apparatus.
Figure 26:
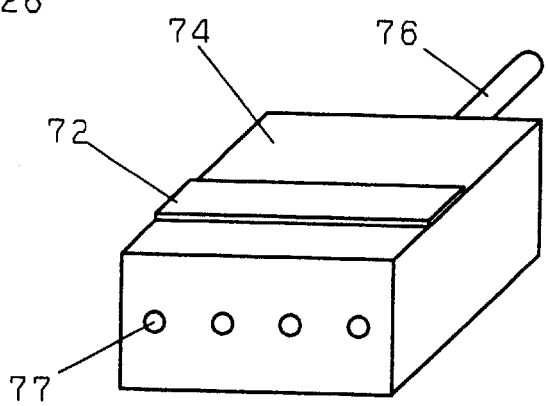
FIG. 26 is a diagram of another gas outlet in the plasma treatment apparatus.
Figure 27:
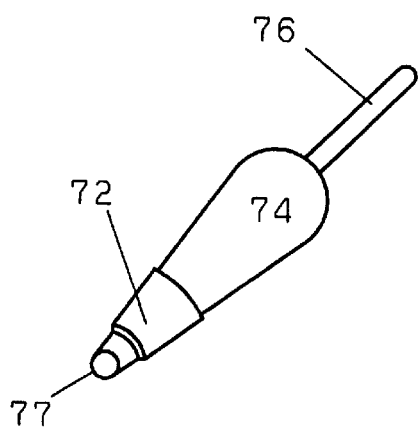
FIG. 27 is a diagram of yet another gas outlet in the plasma treatment apparatus.

An apparatus of FIG. 22 had a dielectric gas reservoir 74 in the shape of FIG. 25 made of 2 mm polymethylmethacrylate plate which had an outside dimension of 110 mm(W)×5 mm(D)×50 mm(H); a gas inlet pipe 76; a gas outlet opening (100 mm×1 mm) 77; and a copper electrode 72 of 100 mm×30 mm×1 mm dimension, mounted near the gas outlet opening 77. The apparatus had another electrode 73 of the same dimension opposing the gas outlet opening 77, in a distance of 10 mm from the first electrode 72. The surface treatment was conducted by placing a 50 micron PET substrate (Lumirror T-50) between the electrode 73 and the gas outlet opening 77 under the following conditions:

Treating gas: Hexafluoropropylene, flow rate 50 sccm Argon (diluting gas), flow rate 4950 sccm;

Impulse field: Waveform (1), onset/offset time 10 $\mu$s, peak value 7.2 kV, field intensity 7.2 kV/cm, frequency 6.8 kHz duration of one pulse 210 $\mu$s;

Treating time: 5 seconds;

Static contact angle was measured by dropping 2 microliter water on the surface of the treated sample. The angle was measured by the semi-automatic contact angle meter CA-X150 manufactured by Kyowa Interface Science, Ltd. The contact angle was increased to 110 to 115 degrees from 72 degrees of untreated surface, in the elongated area of 110 mm×5 mm, where the discharge-plasma contacted the surface to make it water repellent.

EXAMPLES 42, 43, 44, 45, 46 and 47

A PET film substrate was treated in the same apparatus and the same conditions of Example 41 except that the treating gas, the carrier gas and the pulse modulated electric field were altered as specified in Table 11. Static contact

TABLE 10

Plasma treating conditions

| | Waveform | Peak value (kV) | Frequency (kHz) | Duration of pulse in a cycle ($\mu$s) | onset/offset time ($\mu$s) | Treating gas | Flow rate (sccm) | Solit dielectric (Thickness:mm) | Eletrode distance (mm) | Discharge current density (mA/cm$^2$) | Contact angle (degree) |
|---|---|---|---|---|---|---|---|---|---|---|---|
| Example 36 | (a) | 4 | 12 | 20 | 0.1 | 3% CF$_4$/Ar | 100 | thermal sprayed coating file (0.5) | 3 | 8 | 109~112 |
| Example 37 | (a) | 3 | 8 | 25 | 5 | 0.5% C$_2$F$_4$/Ar | 50 | TiO$_2$ (3) | 5 | 7 | 107~110 |
| Example 38 | (a) | 11 | 8 | 100 | 100 | 0.5% C$_3$F$_5$/N$_2$ | 100 | SiO$_2$ (2) | 5 | 15 | 108–112 |
| Example 39 | (a) | 7 | 12 | 20 | 0.1 | N$_2$ | 50 | thermal sprayed coating file (0.5) | 3 | 12 | 22~28 |
| Example 40 | (a) | 6 | 8 | 100 | 10 | 0.8% O$_2$ + 0.2% CF$_4$/Ar | 100 | PTFE (1) | 5 | 3 | 24~30 |
| Reference 7 | Sine wave | 7.5 | 12 | — | — | 3% CF$_4$/Ar | 100 | thermal sprayed coating file (0.5) | 3 | — | 81~85 |

Web traveling Seed: 30 m/min

The examples of Table 10 clearly indicates that the method of this invention provides a more even, faster, continuous surface treatment, compared to the related art.

angles were measured on all the treated surfaces. All the surfaces exhibited hydrophilicity or water repellent capability in the area where the plasma contacted the substrate.

Table 11 indicates the treating conditions and shows the measured angles.

EXAMPLE 48

In the plasma discharge treatment apparatus of Example 41, the dielectric gas reservoir 74 which has the gas inlet pipe 76 and the electrode 72 along the gas outlet opening 77 was mechanically connected to the other electrode 73 by a computer controlled device 78 which was capable of controlling the relative positions among two opposing electrodes and the substrate to be treated. A firmly fixed substrate was a square tube made of unplasticized PVC having an outside dimension of 100 mm×100 mm×100 mm and a wall thickness of 2 mm. By manipulating the device 78, the electrode 73 was positioned inside the square tube and the gas reservoir 74 was placed outside the tube so that the gas outlet opening 77 opposes the electrode 73 indirectly, but holds a distance of 10 mm between them and a distance of 2 mm between the electrode 73 and the inner surface of the tube. Surface treatment was conducted in the same conditions of Example 47 on the outer surface of the tube by moving the treatment apparatus.

The contact angle of outer surface of the tube was measured at a 5 cm interval and readings of 20 to 25 degrees were recorded, in contrast to the untreated contact angle of 81 degrees, which fact indicates the acquired hydrophilicity.
Reference 8

A treating operation was tried in the same apparatus and the same conditions of Example 44 except that the applied voltage had a since waveform of 12.2 kHz. But a high voltage over 10 kV was necessary to initiate a discharge, which was an arc, not a glow. Consequently the PET web was melted and the treatment failed.

For a reference purpose, a very similar treatment was conducted by using a diluting gas of helium instead of argon. The result and the conditions are shown in Table 11 in the column of "reference".

in 1 cm distance and had 1 mm holes in every 10 mm interval, constituted a pair of electrodes 82 and 83. Two short solid dielectric cylinders 84a and 84b of polyethyleneterephthalate, each having a 90 mm inner diameter, a 110 mm outer diameter and a 5 mm length were placed between the electrodes concentrically. A 50 micron thick PET film (Lumirror T-50) having a size of 150 mm×150 mm and an initial contact angle of 75 degrees was clamped between the dielectric walls 84a and 84b for water repellent treatment, which was conducted in the atmosphere of the treating gas specified in Table 12. The treating gas was fed into the treating space 91 continuously at the flow rate specified in Table 12 through the gas inlet pipes 87a and 87b under the atmospheric pressure. The pulse modulated electric field specified in Table 12 was imposed for the period specified in Table 12 to generate discharge plasma.

Static contact angles were measured by dropping 2 microliter water on the water repellent surfaces of the treated samples. The angles were measured by the contact angle meter CA-X150 manufactured by Kyowa Interface Science, Ltd. The largest and the smallest readings are shown in Table 10. The contact angles are larger than those of the untreated surface in the circular area of ϕ90 mm where the discharge plasma contacted the surface to make it water repellent.

EXAMPLE 51

Figure 28:
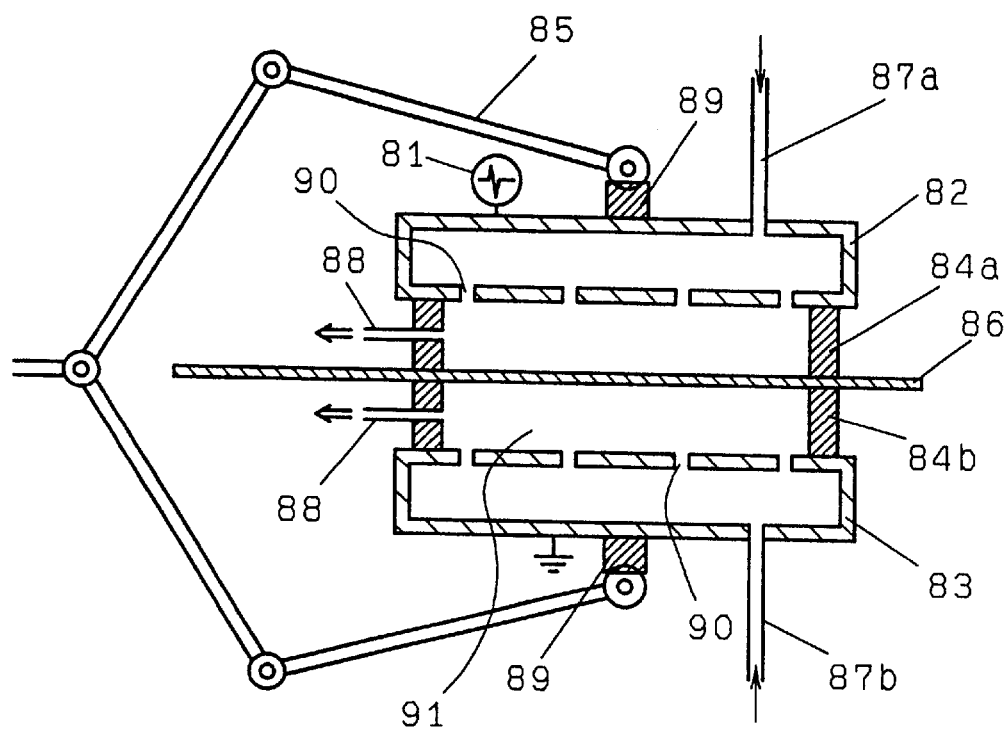
FIG. 28 is a schematic section view showing yet another example of the plasma treatment apparatus used in the present invention.

In the apparatus of FIG. 28, the upper electrode 82 was made of stainless steel (SUS 304) having ϕ1 mm holes in every 10 mm interval and a thermal spray coated surface film of 500 micron zirconium oxide stabilized by yttrium oxide. The upper solid dielectric wall 84a was made of polycarbonate but the lower wall 84b did not exist. A stainless steel (SUS 304) substrate having a dimension of 150 mm×150 mm×2 mm was directly placed on the lower electrode 83. A water repellent treatment was conducted in the atmosphere of the treating gas specified in Table 12 fed into the treating space 91 continuously at the flow rate

TABLE 11

| | | | | | | | | | |
|---|---|---|---|---|---|---|---|---|---|
| | | | | Plasma treating conditions | | | | | |
| | Wave-form | Peak value (kV) | Frequency (kHz) | Duration of pulse in a cycle (μs) | onset/offset time (μs) | Treating gas | Flow rate (sccm) | Solit dielectric | Discharge current density (mA/cm²) | Contact angle (degree) |
| Example 41 | (a) | 7.2 | 6.8 | 210 | 10 | $C_3F_6$ Ar | 50 4900 | PMMA | 8 | 110~115 |
| Example 42 | (d) | 7.1 | 1.0 | 800 | 10 | $N_2$ Ar | 6 4994 | PMMA | 7 | 20~30 |
| Example 43 | (a) | 7.2 | 6.8 | 210 | 10 | 25% $CF_4$ + 75% $O_2$ Ar | 100 4900 | PMMA | 8 | 20~35 |
| Example 44 | (a) | 5.7 | 12 | 100 | 5 | $C_4F_8$ Ar | 150 4850 | PMMA | 7 | 110~115 |
| Example 45 | (a) | 11.7 | 12 | 100 | 5 | $N_2$ | 6000 | PMMA | 11 | 15~25 |
| Example 46 | (a) | 4.5 | 15 | 100 | 0.1 | $CF_4$ Ar | 250 4750 | PMMA | 5 | 105~110 |
| Example 47 | (a) | 8.2 | 18 | 10 | 0.1 | $N_2$ | 6000 | PMMA | 9 | 10~15 |
| Example 48 | (a) | 8.2 | 18 | 10 | 0.1 | $N_2$ | 6000 | PMMA | 9 | 20~25 Square tube |
| Reference 8 | Sine wave | 10.0 | 12 | — | — | $C_4F_8$ Ar | 150 4850 | PMMA | — | Molten by arc discharge |
| (Reference) | Sine wave | 10.0 | 12 | — | — | He | 5000 | — | — | 100~106 |

Treating time: 5 sec.

EXAMPLES 49 and 50

In the apparatus of FIG. 28, two stainless steel (SUS 304) disks of 120 mm diameter which were opposing each other specified in Table 12 through the gas inlet pipes 87a and 87b under the atmospheric pressure. The pulse modulated electric field specified in Table 12 was imposed for the period specified in Table 12 to generate discharge-plasma on the upper side of the substrate.

Static contact angle was measured on the water repellent surface of the treated sample in the same manner as Example 49 and the result is shown in Table 12.

EXAMPLE 52 and 53

PET film substrates were treated to make the surfaces hydrophilic in the same apparatus and the same conditions of Example 49 except that the treating gas, the treating time and the pulse modulated electric field were altered as specified in Table 12. Static contact angles were measured on the treated samples in the same manner as Example 49 and the result is shown in Table 12.

EXAMPLE 54

A PET film substrate was treated to make the upper surface water repellent and the lower surface hydrophilic, simultaneously, in the same apparatus and the same conditions of Example 49 except that the upper treating gas fed through the inlet 87a and the lower treating gas fed through the inlet 87b were different as specified in Table 12. The treating time and the pulse modulated electric field were altered as specified in Table 12. Static contact angles were measured on the treated sample in the same manner as Example 49 and the result is shown in Table 12.

It was proved by the static contact angle measurements that the upper surface became water repellent and the lower surface hydrophilic in the circular area of 90 mm exposed to the plasma.

Reference 9

A treating operation was tried in the same apparatus and the same conditions of Example 49 except that the applied voltage had a sine waveform of 12.2 kHz. But a high voltage over 9 kV was necessary to initiate a discharge, which was an arc, not a glow state. Consequently the PET web was melted and the operation failed. For the reference purpose, a very similar treatment was conducted by using a helium diluting gas instead of argon. The result and the conditions are shown in Table 11 in the column of "Reference 9".

discharge-plasma near, i.e. in and around, the atmospheric pressure regardless of the sort of a gas atmosphere. Since the discharge creates a high density plasma, high level surface treatments can be achieved in a short time. The method will provide a significant advantage to the industrial processes of high speed continuous treatment.

The invention provides open-to-air systems for a surface treatment, because the method does not require any particular atmosphere. This technique is expected to be applied in a wide range of industrial field.

In the present inventions, the high density discharge-plasma can be obtained in a proper gas atmosphere containing molecules of high MW.

In one aspect, the present invention provides the method and the apparatus for a homogeneous, relatively fast, continuous surface treatments near the atmospheric pressure by preventing air intrusion to the plasma space. A counter-flow of treating gas over the surface of plasma contact greatly reduces the air intrusion. Thus, the invention provides the in-line treating process.

The above mentioned discharge-plasma is generated by imposing a pulse modulated electric field, which allows to use a wider range of a treating gas and a wider range of applying voltage to create stable discharges over the prior art. The pulse modulated electric field also provides a high density discharge-plasma which is essential to the high speed continuous treatment.

In another aspect, the present invention provides a surface treatment method of glow-discharge plasma for substrates of various configuration such as web, molded pieces etc. under atmospheric pressure. The method enables a continuous or a partial treatment by using a simple device and a small amount of treating gas, yet not causing uneven finish. This process can be incorporated in other processes and is adequate for the improvement of adhesive property and printability of webs or molded pieces, or for the quality augmentation in dust proof or conductivity.

In another aspect, the present invention provides an apparatus for a glow-discharge plasma treatment effected by imposing a specified pulse modulated electric field, which allows the high level, stable treatment under an atmospheric pressure and allows to use a wider range of a treating gas and

TABLE 12

| | | | | | | | | | | | |
|---|---|---|---|---|---|---|---|---|---|---|---|
| | | | | Plasma treating conditions | | | | | | | |
| | Waveform | Peak value (kV) | Frequency (kHz) | Duration of pulse in a cycle (μs) | onset/offset time (μs) | | Treating gas | Flow rate (sccm) | Treating time (s) | Solit dielectric | Discharge current density (mA/cm²) | Contact angle (degree) |
| Example 49 | (a) | 4.2 | 12.2 | 10 | 0.1 | Upper Lower | 3% CF₄/Ar 3% CF₄/Ar | 2000 2000 | 10 | PET (PTFE) | 15 | 106~110 107~109 |
| Example 50 | (a) | 11.4 | 14.4 | 100 | 5 | Upper Lower | 1% C₄F₃/N₂ 1% C₄F₃/N₂ | 2000 2000 | 10 | PET (PTFE) | 21 | 105~109 107~111 |
| Example 51 | (a) | 7.6 | 8.3 | 200 | 10 | Upper | 3% C₃F₆/Ar | 2000 | 60 | Y₂O₃ stabilise by ZrO₂ (PC) | 53 | 109~115 |
| Example 52 | (a) | 12.8 | 7.5 | 10 | 0.1 | Upper Lower | N₂ N₂ | 2000 2000 | 15 | PET (PTFE) | 25 | 22~28 20~28 |
| Example 53 | (a) | 7.8 | 18.2 | 100 | 5 | Upper Lower | 2.5% O₂ + 0.5% CF₄/Ar 2.5% O₂ + 0.5% CF₄/Ar | 2000 2000 | 15 | PET (PTFE) | 13 | 25~30 26~29 |
| Example 54 | (a) | 5.0 | 16.8 | 10 | 0.1 | Upper Lower | 3% C₃F₃/Ar 5% O₂/Ar | 2000 2000 | 30 | PET (PTFE) | 18 | 107~112 28~35 |
| Reference 9 | — | 5.5 | 12.2 | Sine wave | | Upper Lower | 3% Cf₄/He 3% Cf₄/He | 2000 2000 | 10 | PET (PTFE) | — | 100~105 97~105 |

The present invention basically provides a method and an apparatus to generate a stable and uniformly dispersed a wider range of voltage to create stable discharges over the prior art. The specified pulse modulated electric field of this invention also provides a high density discharge-plasma which is preferred for the high speed continuous treatment.

In another aspect, the present invention provides a method of glow-discharge plasma treatment in a gas atmosphere of atmospheric pressure, in which the discharge-plasma is caused to contact the surface of the substrate being treated to thereby easily achieve a partial surface treatment.

In this method, the discharge-plasma is generated by imposing a pulse modulated electric field, which allows to use a wider range of treating gas and a wider range of voltage to create stable discharges over the prior art. The pulse modulated electric field also provides a high density discharge-plasma which is essential to the high speed continuous treatment.

In another aspect, the present invention provides an apparatus of glow-discharge plasma treatment near the atmospheric pressure, by which the simultaneous treatment of both sides of a substrate can be conducted by a compact device, thus making the process simpler and enabling to be incorporated in other processes.

In another aspect, the present invention provides a method and an apparatus for generating a glow-discharge by imposing a pulse modulated electric field, which does not transform to an arc discharge.

In another aspect, the present invention provides a stable treatment method in the atmosphere of argon and/or nitrogen which are more economical than helium. The method has a great commercial advantage.

In another aspect, the present invention provides a method and an apparatus for generating a high density discharge-plasma under a relatively low voltage. This plasma achieves fast batch treatments or high speed continuous treatments.

In another aspect, the present invention provides a thermally stable treating method by using an inorganic dielectric placed on the electrode, which also prevents an arc discharge.

In another aspect, the present invention provides a method to generate a stable, uniformly dispersed and yet highly condensed discharge-plasma regardless of the sort of a gas atmosphere, which can achieve the accelerated and high level surface treatments.

When the invention is applied to industrial processes of surface treatments for various materials and parts, the invention provides very significant results.

What is claimed is:

1. A method of glow-discharge plasma treatment, comprising:
    placing a substrate between two opposing electrodes, at least one of opposing surfaces of the opposing electrodes being covered with a solid dielectric; and
    imposing an electric field between the opposing electrodes around an atmospheric pressure, the electric field being pulse modulated in a manner such that an onset time of a pulse of the electric field is less than 100 $\mu$s and field intensity is 1 to 100 kV/cm.

2. A method of claim 1, wherein the electric field is pulse modulated to a frequency of 0.5 to 100 kHz and has a pulse duration of 1 to 1000 microseconds in a cycle.

3. A method of claim 1, wherein the electric field is pulse modulated in a high voltage pulse power unit, which comprises a high voltage direct current source and a pulse controller converting a high voltage direct current to high voltage pulses by means of semiconductor elements having a turning-on time or a turning-off time of less than 500 nanoseconds.

4. A method of claim 1, wherein the glow-discharge plasma is generated in a gas atmosphere, at least 10% of the gas having a molecular weight of 10 or higher.

5. A method of claim 1, wherein the plasma is generated in a gas atmosphere containing at least one of argon and nitrogen.

6. A method of claim 1, wherein the plasma is generated in a gas atmosphere containing a compound having a metal element.

7. A method of claim 1, wherein the imposed electric field is pulse modulated and energized to generate a discharge current density of 0.2 to 300 mA/cm$^2$ between the electrodes.

8. A method of claim 1, wherein the solid dielectric has a dielectric constant of 10 or higher at 25° C. and said electrodes are flat parallel plates without holes.

9. A method of claim 1, wherein the solid dielectric is a metal oxide compound containing 5 to 50 wt % titanium oxide and 50 to 95 wt % aluminum oxide.

10. A method of claim 1, wherein the solid dielectric is a metal oxide compound containing zirconium oxide.

11. A method of glow-discharge plasma treatment, comprising: providing two opposing electrodes in a closed treating chamber, at least one of opposing surfaces of the opposing electrodes being covered with a solid dielectric, said closed treating chamber having an entrance and an exit for feeding a substrate, which allow a gas to leak therethrough;
    continuously feeding the substrate through the entrance of the treating chamber, guiding the substrate between the two electrodes and hauling the substrate through the exit of the treating chamber;
    supplying a treating gas in the treating chamber to contact the substrate, said treating gas flowing in a direction opposite to a moving direction of the substrate; and
    imposing an electric field between the opposing electrodes while the substrate is passing therebetween, said electric field being pulse modulated in a manner such that an onset time of a pulse of the electric field is less than 100 $\mu$s and field intensity is 1 to 100 kV/cm.

12. A method of glow-discharge plasma treatment, comprising:
    providing a gas reservoir made of a solid dielectric and having a gas outlet opening, one electrode mounted on the reservoir, and the other electrode away from the one electrode;
    placing a substrate between the gas outlet opening and the other electrode;
    ejecting a treating gas continuously from the gas outlet opening; and
    imposing an electric field between the one and the other electrodes, said electric field being pulse modulated in a manner such that an onset time of a pulse of the electric field is less than 100 $\mu$s and field intensity is 1 to 100 kV/cm.

13. A method of glow-discharge plasma treatment, comprising:
    placing a substrate in a space formed by two opposing electrodes and surrounding walls made of a dielectric, said space being filled with a treating gas; and
    exposing the substrate to plasma generated by an electric field imposed between the electrodes around an atmospheric pressure, said electric field being pulse modulated in a manner such that an onset time of a pulse of the electric field is less than 100 $\mu$s and field intensity is 1 to 100 kV/cm.

14. An apparatus for glow-discharge plasma treatment comprising:
    two opposing electrodes;

a solid dielectric disposed on a surface of at least one of the electrodes; and a high voltage pulse power unit generating a pulse modulated electric field, said pulse modulated electric field having an onset time of a pulse less than 100 μs, said power unit including a high voltage direct current source and a pulse controller converting a high voltage direct current to high voltage pulses by means of semiconductor elements having a turning-on time and a turning-off time of less than 500 nanoseconds.

15. An apparatus for glow-discharge plasma treatment, comprising:

a closed treating chamber having an entrance and an exit adapted to continuously transfer a substrate from the entrance to the exit;

two opposing electrodes located in the chamber, at least one of the opposing electrodes having a solid dielectric on a surface opposing the other of the opposing electrodes;

a gas spout formed in the treating chamber adapted to eject a treating gas on the substrate in a direction opposite to a moving direction of the substrate; and a high voltage pulse power unit electrically connected to the electrodes to impose a pulse modulated electric field between the opposing electrodes, the electric field having an onset time of a pulse less than 100 μs and field intensity of 1 to 100 kV/cm.

16. An apparatus of claim 15, in which said high voltage power unit comprises a high voltage direct current source, and a pulse controller converting high voltage direct current to high voltage pulses by means of semiconductor elements having a turning-on time and/or a turning-off time of less than 500 nanoseconds.

17. An apparatus of claim 16, in which said pulse controller provides a discharge stopping time between the high voltage pulses in one cycle, said discharge stopping time being formed at least once in 1 ms.

18. A method of claim 4, wherein the solid dielectric has a dielectric constant of 10 or higher at 25° C. and said electrodes are flat parallel plates without holes.

19. An apparatus for glow-discharge plasma treatment, comprising:

a gas reservoir made of a solid dielectric, said gas reservoir having a gas outlet opening adapted to eject a treating gas continuously, one electrode mounted near the gas outlet opening and the other electrode mounted opposite to the gas outlet opening; and a high voltage pulse power unit connected to the one and the other electrodes to impose a pulse modulated electric field between the two electrodes, said electric field having an onset time of a pulse less than 100 μs and field intensity of 1 to 100 kV/cm.

20. An apparatus for glow-discharge plasma treatment, comprising:

a pair of horizontally installed electrodes and vertically installed walls made of a solid dielectric for surrounding the electrodes to thereby form a treating space;

inlet and outlet pipes connected to the treating space, said inlet pipe introducing a treating gas and the outlet pipe ventilating the gas in the treating space; and a high voltage pulse power unit connected to the electrodes to impose a pulse modulated electric field between the two electrodes, the electric field having an onset time of a pulse less than 100 μs, and field intensity of 1 to 100 kV/cm.

* * * * *